United States Patent
Tien et al.

(10) Patent No.: US 12,368,046 B2
(45) Date of Patent: *Jul. 22, 2025

(54) METHOD AND STRUCTURE OF CUT END WITH SELF-ALIGNED DOUBLE PATTERNING

(71) Applicant: Taiwan Semiconductor Manufacturing Co., Ltd., Hsin-Chu (TW)

(72) Inventors: Hsi-Wen Tien, Hsinchu County (TW); Wei-Hao Liao, Hsinchu (TW); Pin-Ren Dai, Hsinchu (TW); Chih Wei Lu, Hsinchu (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/543,432

(22) Filed: Dec. 18, 2023

(65) Prior Publication Data

US 2024/0120200 A1  Apr. 11, 2024

Related U.S. Application Data

(63) Continuation of application No. 17/189,130, filed on Mar. 1, 2021, now Pat. No. 11,848,207, which is a continuation of application No. 16/571,407, filed on Sep. 16, 2019, now Pat. No. 10,937,652.

(51) Int. Cl.
*H01L 21/033* (2006.01)
*H01L 21/768* (2006.01)

(52) U.S. Cl.
CPC ...... *H01L 21/0337* (2013.01); *H01L 21/0332* (2013.01); *H01L 21/76877* (2013.01)

(58) Field of Classification Search
CPC ............. H01L 21/0337; H01L 21/0332; H01L 21/76877; H01L 21/31144; H01L 21/76831; H01L 21/76816; H01L 21/76838; H01L 21/0338; H01L 23/522; H01L 2221/1068
USPC ........................................................ 257/288
See application file for complete search history.

(56) References Cited

U.S. PATENT DOCUMENTS

| | | | |
|---|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

*Primary Examiner* — Caleen O Sullivan
(74) *Attorney, Agent, or Firm* — HAYNES AND BOONE, LLP

(57) ABSTRACT

Semiconductor device and the manufacturing method thereof are disclosed herein. An exemplary method of forming a semiconductor device comprises receiving a structure including a substrate and a first hard mask over the substrate, the first hard mask having at least two separate portions; forming spacers along sidewalls of the at least two portions of the first hard mask with a space between the spacers; forming a second hard mask in the space; forming a first cut in the at least two portions of the first hard mask; forming a second cut in the second hard mask; and depositing a cut hard mask in the first cut and the second cut.

20 Claims, 23 Drawing Sheets

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,520,482 B1 | 12/2016 | Chang et al. |
| 9,537,007 B2 | 1/2017 | Yang et al. |
| 9,576,814 B2 | 2/2017 | Wu et al. |
| 9,691,775 B1 | 6/2017 | Licausi et al. |
| 10,134,604 B1 | 11/2018 | Huang et al. |
| 10,504,775 B1 | 12/2019 | Hsiao et al. |
| 10,559,492 B2 | 2/2020 | Peng et al. |
| 10,937,652 B1 | 3/2021 | Tien et al. |
| 11,848,207 B2 * | 12/2023 | Tien .................. H01L 21/76816 |
| 2016/0020216 A1 | 1/2016 | Lin et al. |
| 2020/0168500 A1 | 5/2020 | Lazzarino et al. |
| 2021/0183654 A1 | 6/2021 | Tien et al. |

\* cited by examiner

METHOD AND STRUCTURE OF CUT END WITH SELF-ALIGNED DOUBLE PATTERNING

PRIORITY DATA

The Present Application is a continuation application of U.S. patent application Ser. No. 17/189,130, filed Mar. 1, 2021, which is a continuation application of U.S. patent application Ser. No. 16/571,407, filed Sep. 16, 2019, each of which is incorporated herein by reference in its entirety.

BACKGROUND

The electronics industry has experienced an ever-increasing demand for smaller and faster electronic devices which are simultaneously able to support a greater number of increasingly complex and sophisticated functions. These goals have been achieved by scaling down semiconductor IC dimensions (e.g., minimum feature size) and thereby improving production efficiency and lowering associated costs. However, such scaling has also introduced increased complexity to the semiconductor manufacturing process.

For example, aggressive scaling down of IC dimensions, i.e. smaller pitches and critical dimensions, has resulted in difficulties to control the line end distance, especially for self-aligned double patterning (SADP). It has been observed that overlay (mask shifting) issues happened during the fabrication of semiconductor devices, which may cause conductive bridge between the metal wires and degrade the performance of the IC. Accordingly, the pattern density is limited, and the chip performance is degraded. Improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
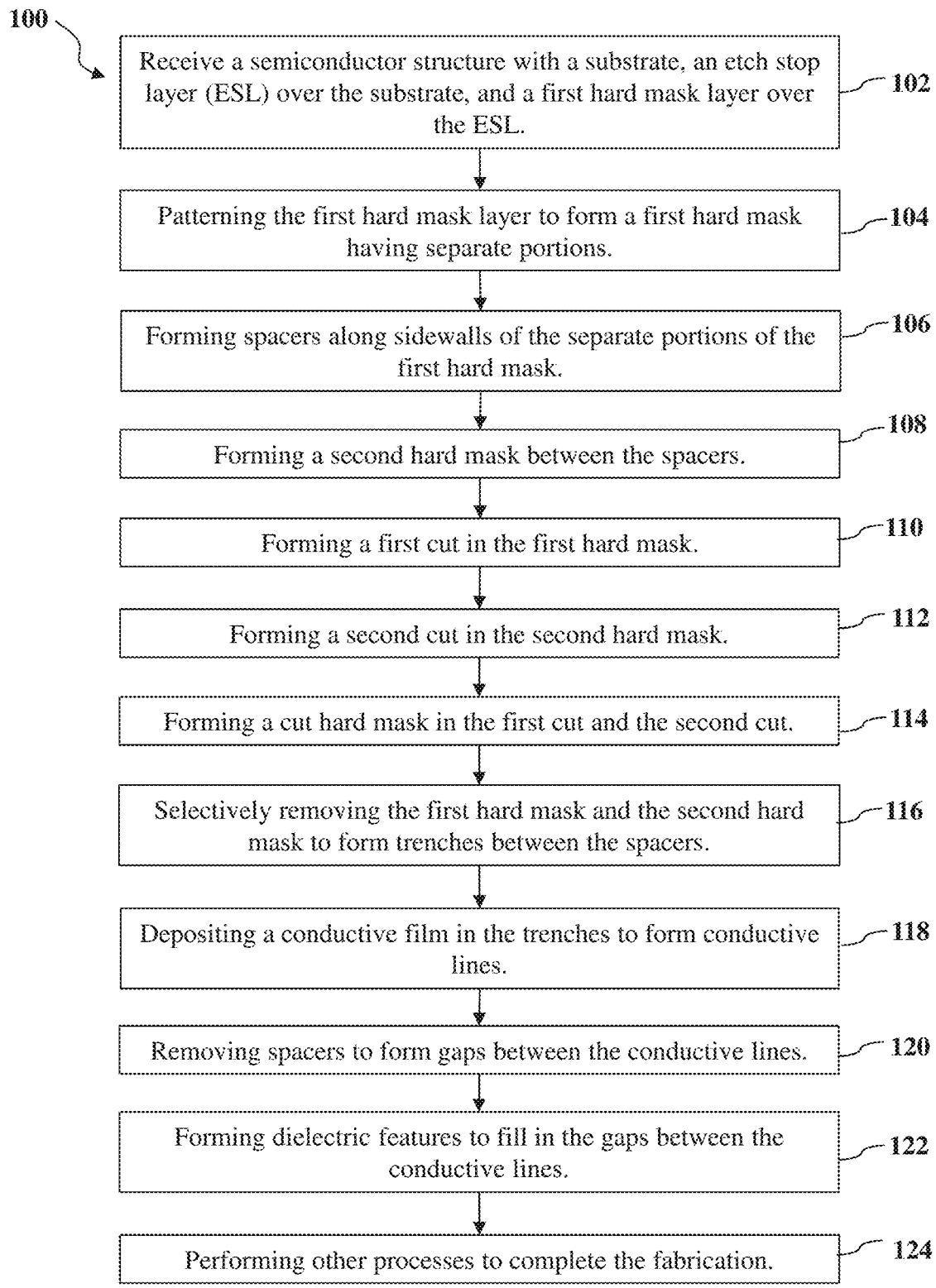
FIG. 1 illustrates a flowchart of an example method for making a semiconductor structure in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to forming conductive features (such as metal wires) with self-aligned double patterning (SADP) during the fabrication of an integrated circuit (IC).

Due to the aggressive scaling down of IC dimensions, overlay (mask shifting) issues have been observed in the fabrication of semiconductor devices. During the formation of interconnect layer(s), it is very difficult to control the line end window due to the smaller critical dimensions (CD) and the selectivity challenge between the adjacent materials. Conductive bridge may happen between the adjacent conductive features, which may cause manufacturing defects and/or current leakage.

The present disclosure introduces a self-aligned cut process with SADP to provide large line end window during conductive feature formation, such that the overlay issues can be mitigated, and higher pattern density can be achieved. In the present disclosure, a first hard mask and a second hard mask are alternately formed over a substrate, and spacers are formed between the first hard mask and the second hard mask. The first hard mask, the second hard mask, and the spacers include different materials to provide different etching selectivity. Thereafter, different cuts are formed in the first hard mask and the second hard mask, respectively. Since the first hard mask and the second hard mask are alternately formed and are separated by spacers, larger etching windows are provided when performing the different cuts. Subsequently, a cut hard mask is filled in the different cuts in the first and the second hard masks to mitigate the overlay issues due to the small CD and the selectivity challenge. Of course, these advantages are merely example, and no particular advantage is required for any particular embodiment.

FIG. 1 illustrates a flow chart of a method 100 for forming a semiconductor structure 200 (hereinafter called structure 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various cross-sectional views and planar top views of structure 200 during intermediate steps of method 100. In particular, FIGS. 2A-23A illustrate cross-sectional views of structure 200 (that is, in an x-z plane) at intermediate stages of the method of FIG. 1 in accordance with some embodiments of the present disclosure. FIGS. 2B-23B illustrate planar top views of structure 200 (that is, in an x-y plane) at intermediate stages of the method of FIG. 1 in accordance with some embodiments of the present disclosure.

Structure 200 may be an intermediate device fabricated during processing of an integrated circuit (IC), or a portion thereof, that may include static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Structure 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, structure 200 may be a portion of an IC chip, a system on chip (SoC), or a portion thereof. The present disclosure is not limited to any particular number of devices or device regions, or to any particular device configurations. FIGS. 2A-23A and 2B-23B have been simplified for the sake of clarity to better understand the inventive concepts of the present disclosure. Additional features can be added in structure 200, and some of the features described below can be replaced, modified, or eliminated in other embodiments of the structure 200.

Figure 2A:
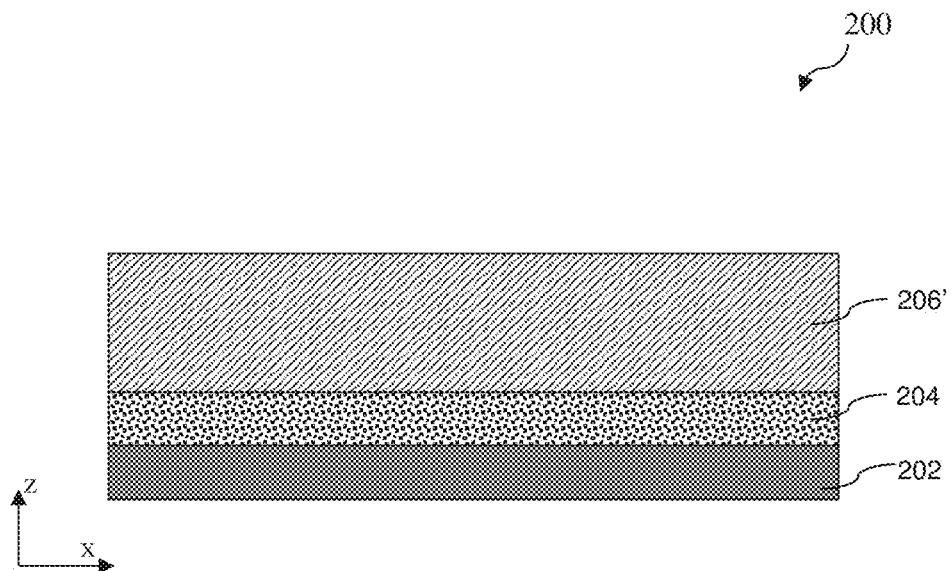
FIGS. 2A, 3A, 4A, 5A, 6A, 7A, 8A, 9A, 10A, 11A, 12A, 13A, 14A, 15A, 16A, 17A, 18A, 19A, 20A, 21A, 22A, and 23A illustrate cross-sectional views of an example semiconductor structure at intermediate stages of the method of FIG. 1 in accordance with some embodiments of the present disclosure.
Figure 2B:
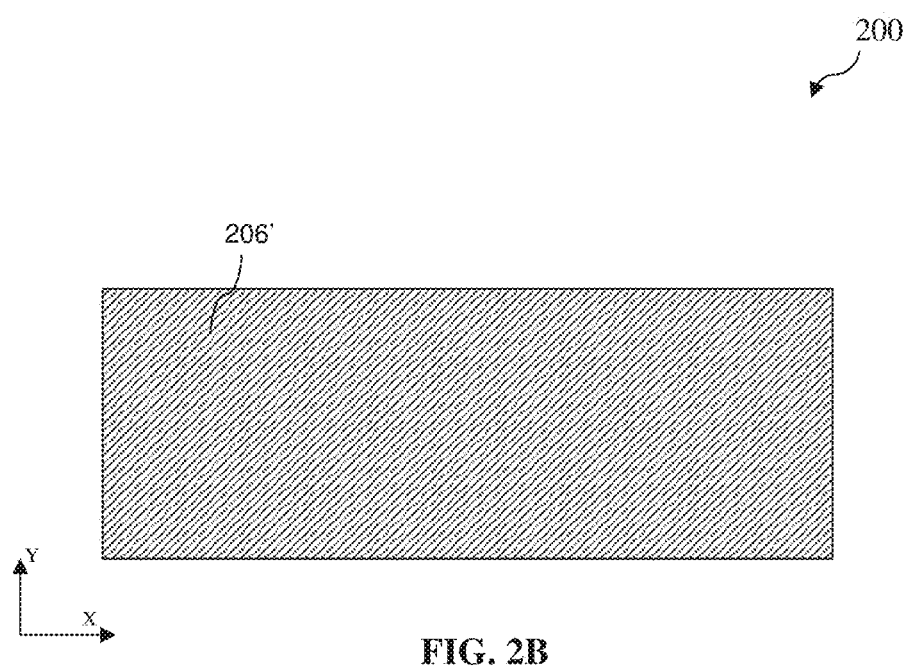
FIGS. 2B, 3B, 4B, 5B, 6B, 7B, 8B, 9B, 10B, 11B, 12B, 13B, 14B, 15B, 16B, 17B, 18B, 19B, 20B, 21B, 22B, and 23B illustrate planar top views of the example semiconductor structure at intermediate stages of the method of FIG. 1 in accordance with some embodiments of the present disclosure.

Referring to FIGS. 1, 2A and 2B, at operation 102, a structure 200 is received. The structure 200 includes a substrate 202, an etch stop layer (ESL) 204 over the substrate 202, and a first hard mask layer 206 over the ESL 204.

In the depicted embodiment of FIGS. 2A and 2B, substrate 202 is a bulk substrate that includes silicon (Si). Alternatively or additionally, the bulk substrate includes another semiconductor, such as germanium (Ge); a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 202 may include indium tin oxide (ITO) glass, include silicon on insulator (SOI) substrate, be strained and/or stressed for performance enhancement, include epitaxial regions, doped regions, and/or include other suitable features and layers. Particularly, the substrate 202 may include active regions (such as fin active regions) and isolation structures as well as various active and passive devices, such as p-type field effect transistors (PFETs), n-type FETs (NFETs), multi-gate FETs such as FinFETs and gate-all-around (GAA) FETs, metal-oxide semiconductor field effect transistors (MOSFETs), complementary metal-oxide semiconductor (CMOS) transistors, bipolar transistors, high voltage transistors, high frequency transistors, static random access memory (SRAM) cells, other memory cells, resistors, capacitors, inductors, or combinations thereof.

Still referring to FIGS. 2A and 2B, the ESL 204 is disposed over the substrate 202. In some embodiments, the ESL 204 includes a dielectric material, such as a material that includes silicon, oxygen, and/or nitrogen. For example, the ESL 204 may include aluminum oxide (AlOx), aluminum oxy-nitride (AlON), silicon carbide (SiC), silicon dioxide ($SiO_2$), silicon oxy-carbide (SiOC), silicon nitride (SiN), silicon carbonitride (SiCN), silicon oxy-nitride (SiON), silicon oxy-carbonitride (SiOCN), other dielectric material, or combinations thereof. The ESL 204 may be formed by a deposition process, such as chemical vapor deposition (CVD), physical vapor deposition (PVD), atomic layer deposition (ALD), other suitable methods, or combinations thereof. In some embodiments, a thickness of the ESL 204 in the z-direction is about 10 to 300 Angstrom (Å).

Still referring to FIGS. 2A and 2B, the structure 200 also include a hard mask layer 206' over the ESL 204 and the substrate 202. In some embodiments, the first hard mask layer 206' includes a material such as tantalum (Ta), tantalum nitride (TaN), titanium nitride (TiN), zirconium dioxide ($ZrO_2$), titanium dioxide ($TiO_2$), titanium silicon oxide (TiSiO), zirconium titanium oxide (ZrTiO), hafnium oxide (HfO), $SiO_2$, SiOC, SiC, SiCN, $Si_3N_4$, tungsten oxide (WxOy), tungsten nitride (WN), tungsten carbide (WC), tungsten carbonitride (WCN), tungsten (W), other proper materials, or combinations thereof. The first hard mask layer may be deposited over the ESL 204 by a suitable deposition process including, PVD, CVD, ALD, spin on, other deposition process, or combinations thereof. In some embodiments, a deposition temperature may be controlled to be about 25° C. to about 400° C. In some further embodiments, a thickness of the first hard mask layer in the z-direction is about 10 Å to about 1000 Å.

Figure 3A:
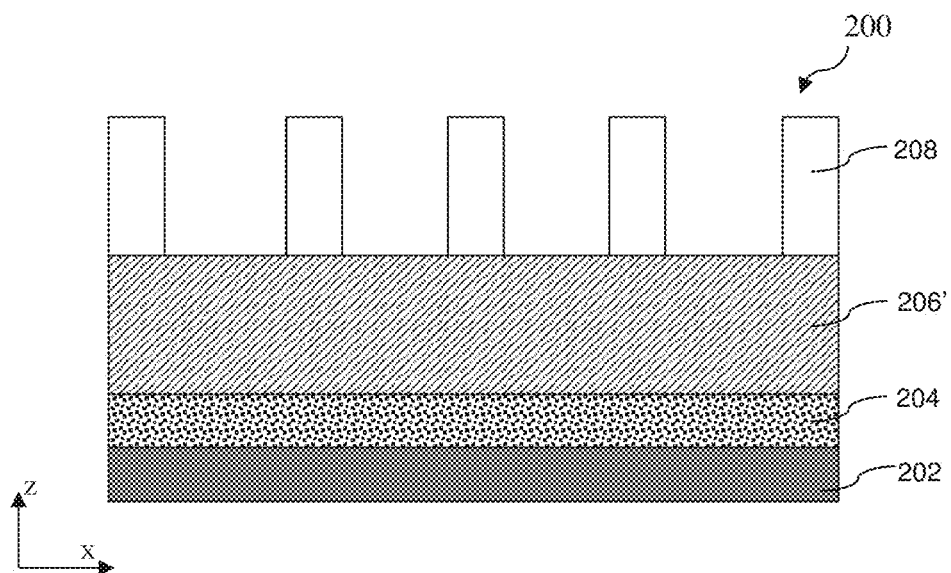
Figure 3B:
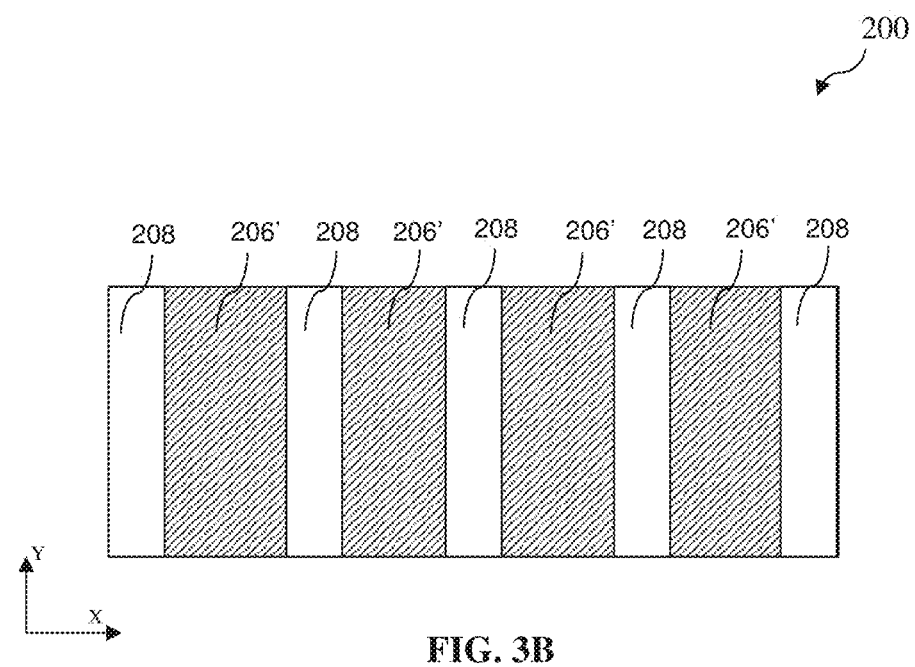

Now referring to FIGS. 1, 3A-3B, and 4A-4B, at operation 104, the first hard mask layer 206' is patterned to form a first hard mask 206. Referring to FIGS. 3A and 3B, a patterned photoresist 208 is deposited over the first hard mask layer 206'. The photoresist 208 is patterned to include a plurality of patterns. Portions of the first hard mask layer 206' are exposed from the patterned photoresist 208 as depicted in FIG. 3B.

Figure 4A:
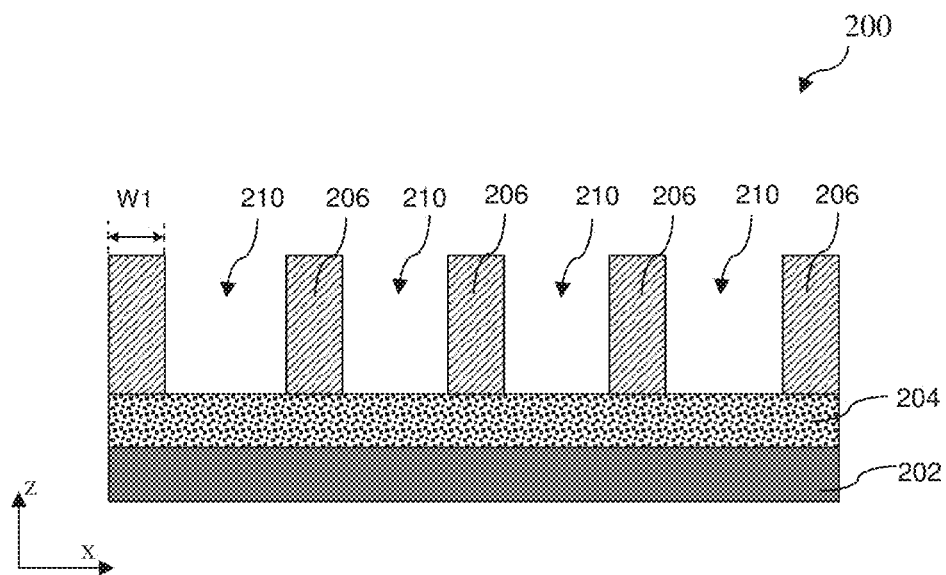
Figure 4B:
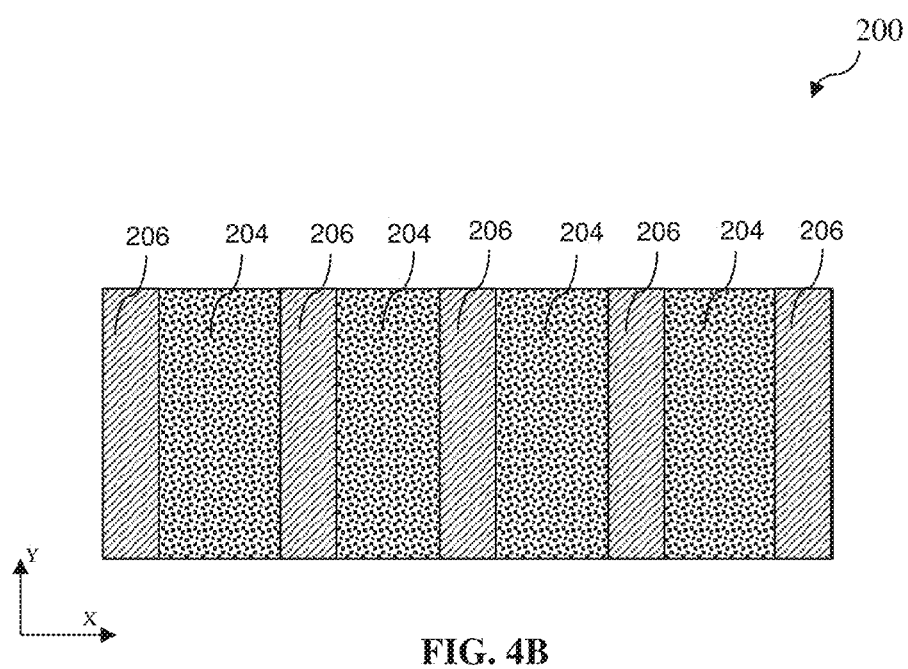

Referring to FIGS. 4A and 4B, the patterned photoresist 208 is used as a mask element to remove the exposed portions of the first hard mask layer 206' to form the first hard mask 206. The removing process may include a dry etch, a wet etch, or combinations thereof. In some embodiments, exposed portions of the first hard mask layer may be removed by a reactive ion etching (RIE) process with etching gases such as $CH_4$, $CH_3F$, $CH_2F_2$, $CHF_3$, $C_4F_8$, $C_4F_6$, $CF_4$, HF, $NH_3$, $CH_3OH$, $C_2H_5OH$, Hz, HBr, CO, $CO_2$, $O_2$, $BCl_3$, or $Cl_2$, and carrier gases such as $N_2$, He, Ne, or Ar. After the etching process, remaining portions of the first hard mask layer 206' become the first hard mask 206. As depicted in FIG. 4A, the first hard mask 206 includes a plurality of lines separated from each other, each of them may be referred to as a first hard mask line 206. A trench 210 is formed between two adjacent lines of the first hard mask 206. Each of the first hard mask line 206 have a width W1 in the x-direction. In some embodiments, the width W1 is about 5 Å to about 300 Å. In some embodiments, a sidewall of the first hard mask line 206 may not be perpendicular (90°) to the x-direction. For example, the sidewall of each of the first hard mask line 206 may have a profile that is about 50° to about 130° to the x-direction.

Figure 5A:
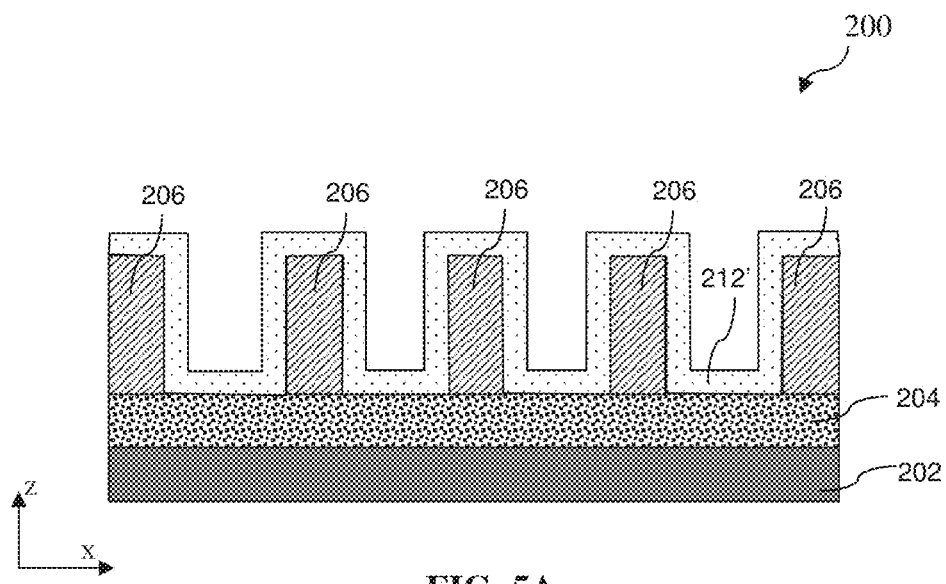
Figure 5B:
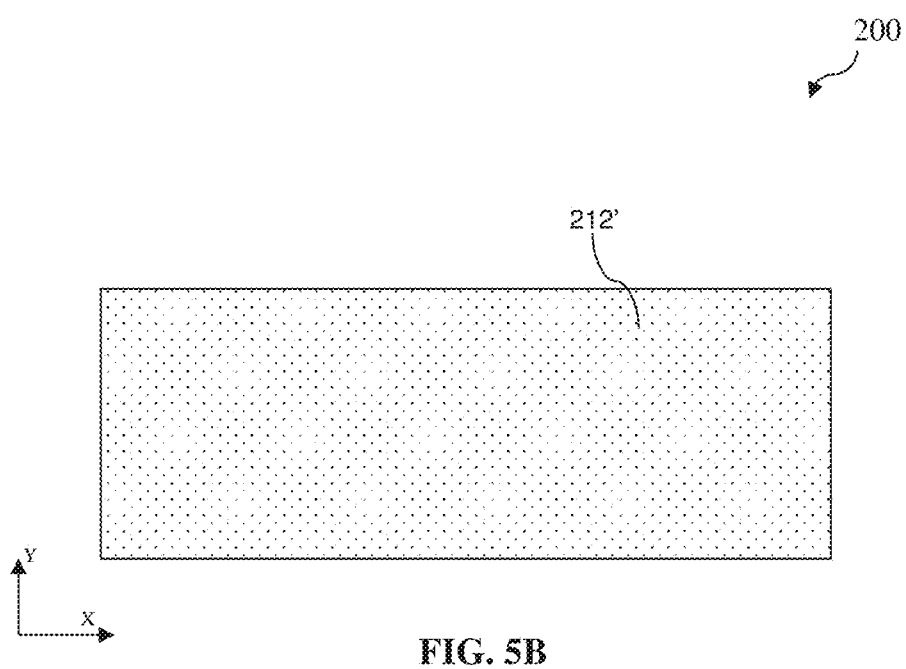
Figure 6A:
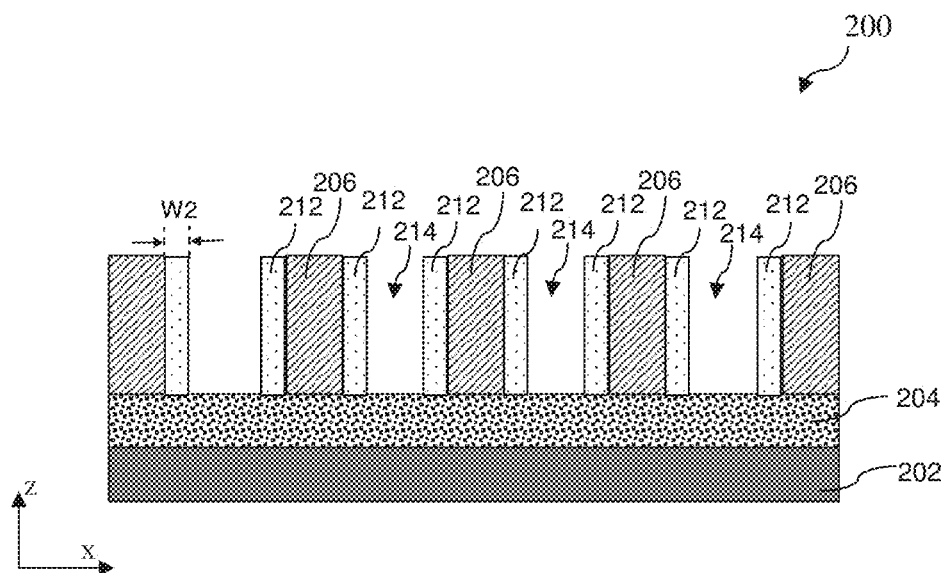
Figure 6B:
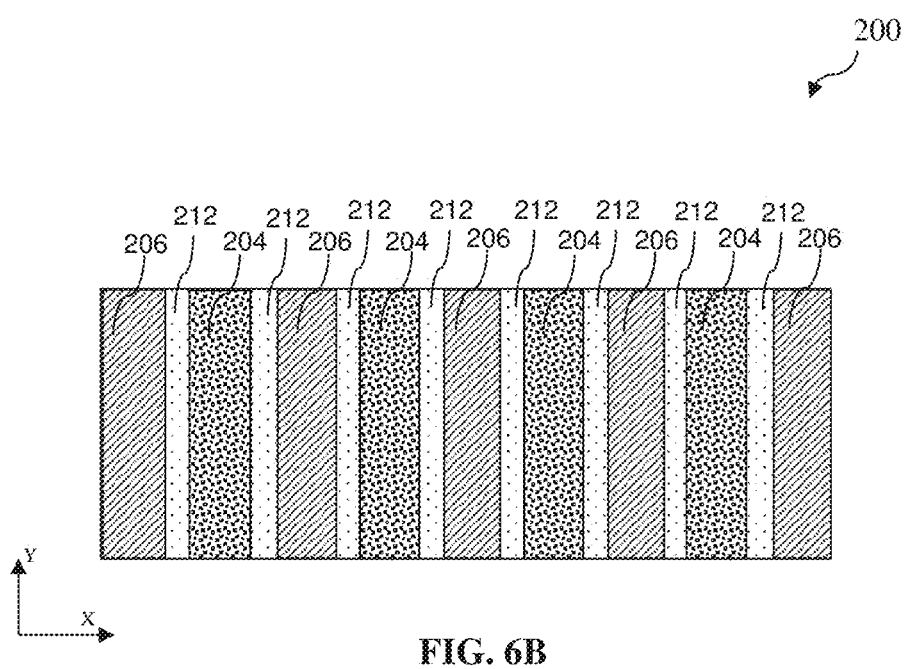

Turning to FIGS. 1, 5A-5B, and 6A-6B, at operation 106, spacers 212 are formed along sidewalls of the separate lines of the first hard mask 206. Referring to FIGS. 5A and 5B, a spacer layer 212' is deposited over the ESL 204 and the first hard mask 206. The spacer layer 212' include a material that is different than the material of the first hard mask 206, such that the materials can provide different etching selectivity in subsequent etching processes. In some embodiments, the spacer layer 212' includes a material such as Ta, TaN, TiN, $ZrO_2$, $TiO_2$, TiSiO, ZrTiO, HfO, $SiO_2$, SiOC, SiC, SiCN, $Si_3N_4$, WxOy, WN, WC, WCN, W, other proper materials, or combinations thereof. In some embodiment, the spacer layer 212' is conformally deposited by ALD, such that the spacer layer 212' has a substantially uniform thickness in the x-direction and in the z-direction. In some other embodiments, the spacer layer 212' may be deposited by CVD, PVD, spin on, other deposition method, or combinations thereof. Referring to FIGS. 6A and 6B, an anisotropic etching process is performed to remove portions of the spacer layer 212' in the x-direction while keep portions of the spacer layer 212' in the z-direction substantially unchanged. The remaining portions of the spacer layer 212' in the z-direction become the spacers 212. As depicted in FIG. 6A, each of the spacers 212 along a sidewall of the first hard mask line 206 has a width W2 in the x-direction. In some embodiments, the width W2 is about 5 Å to about 270 Å, which is about 50% to 200% of the width W1 of the first hard mask line 206. According to the profiles of the first hard mask line 206, the spacers 212 may also have a profile that is about 50° to about 130° tilted relative to the x-direction. In the depicted embodiments, spaces 214 are formed between the spacers 212. Portions of the ESL 204 are exposed from the spaces 214.

Figure 7A:
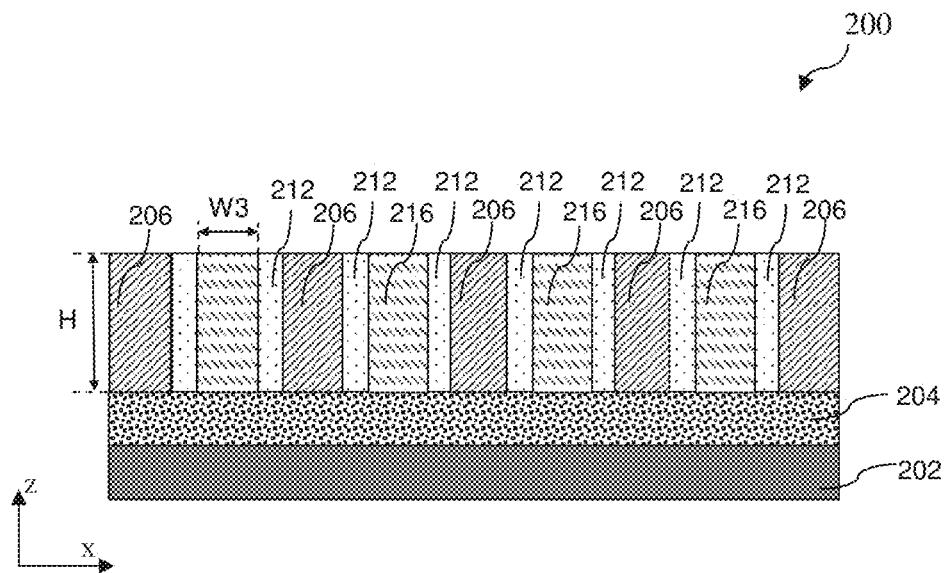
Figure 7B:
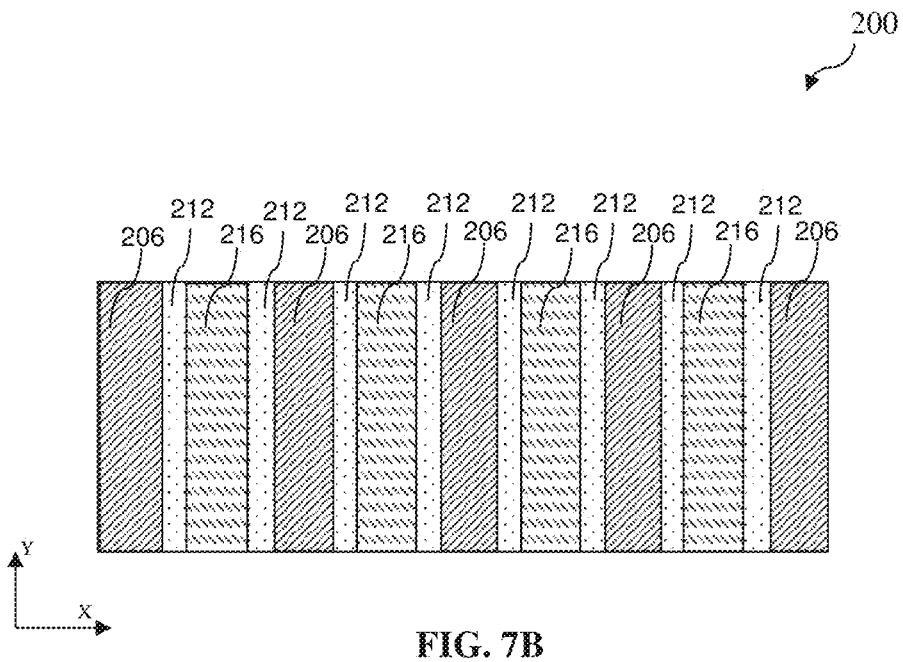

Now referring to FIGS. 1, and 7A-7B, at operation 108, a second hard mask 216 is formed in the openings 214. The second hard mask 216 includes a material that is different than the material of the first hard mask 206 and the spacers 212, such that the materials can provide different etching selectivities in subsequent etching processes. In some embodiments, the second hard mask 216 include a material such as Ta, TaN, TiN, $ZrO_2$, $TiO_2$, TiSiO, ZrTiO, HfO, $SiO_2$, SiOC, SiC, SiCN, $Si_3N_4$, WxOy, WN, WC, WCN, W, other proper materials, or combinations thereof. In some embodiments, the second hard mask 216 is deposited in the openings 214 over the ESL 204 by CVD, PVD, ALD, spin on, other deposition method, or combinations thereof. As depicted in FIGS. 7A and 7B, the second hard mask 216 includes a plurality of lines separated by the spacers 212 and the first hard mask 206. Each of the separated lines may be referred to as a second hard mask line 216. In other words, the first hard mask line 206 and the second hard mask line 216 are alternately disposed over the ESL 204 and are separated by a spacer 212. And, a sidewall of a spacer 212 directly contacts either a sidewall of a first hard mask line 206 or a sidewall of a second hard mask line 216. In some embodiments, a width W3 in the x-direction of each of the second hard mask lines 216 is about 5 Å to about 300 Å, which is about 50% to about 200% of the width W2 of the spacer 212, and is about 30% to about 330% of the width W1 of the first hard mask line 206. After the deposition of the second hard mask 216, a planarization process, such as a CMP, may be performed to planarize a top surface of the structure 200. As depicted in FIG. 7A, after the planarization, a height H in the z-direction of the first hard mask 206, the second hard mask 216, and the spacers 212 is about 10 Å to about 1000 Å. The second hard mask 216 directly contacts the spacers 212, thus the sidewall profile of the second hard mask 216 matches the sidewall profile of the spacers 212, which may be about 50° to about 130° tilted relative to the x-direction.

Figure 8A:
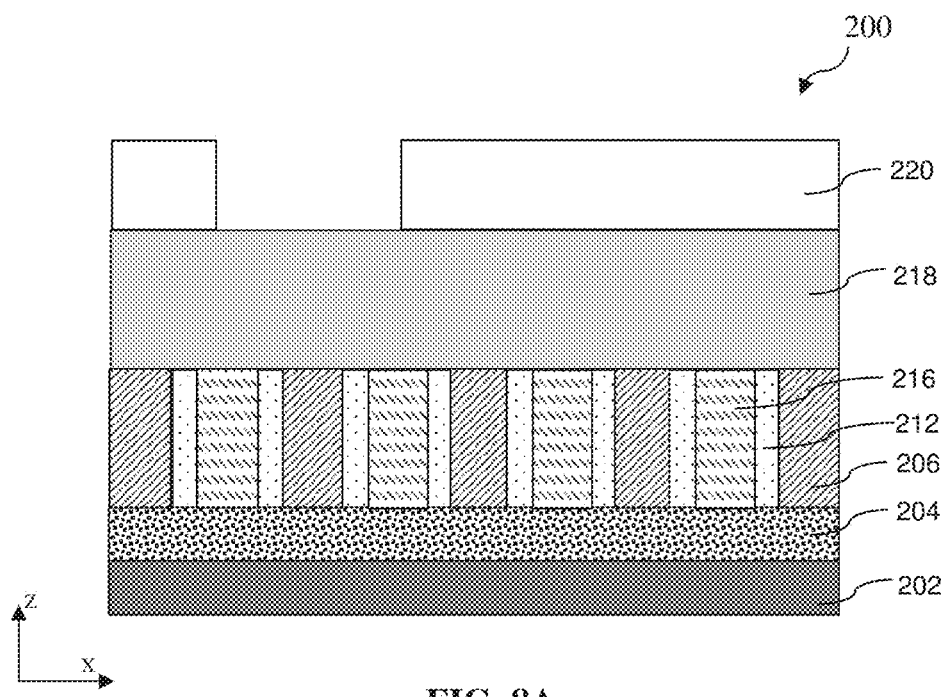
Figure 8B:
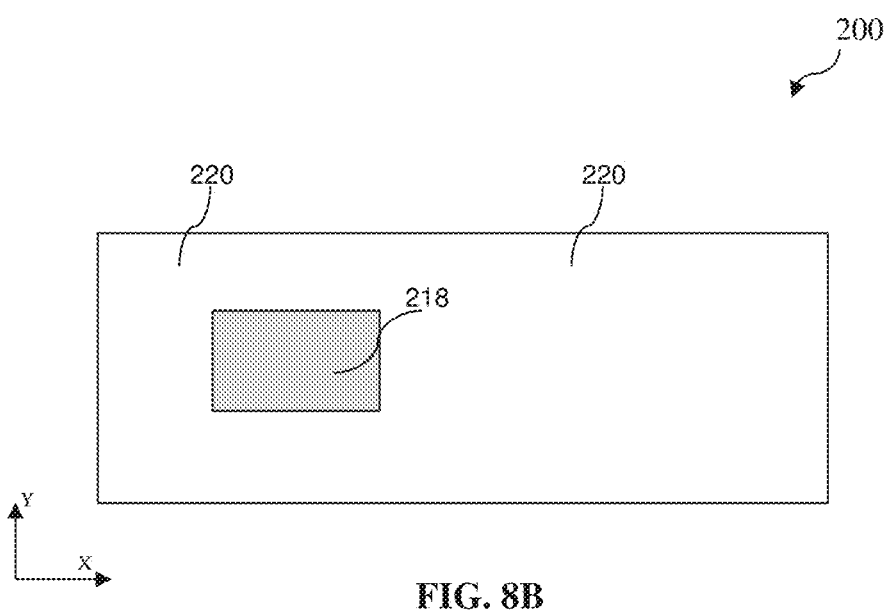

Now referring to FIGS. 1, 8A-8B to 11A-11B, at operation 110, a first cut 224 is formed in a first hard mask line 206 by a self-aligned patterning process. The self-aligned patterning process to form the first cut 224 includes several steps. For example, first as illustrated in FIGS. 8A and 8B, a third hard mask layer 218 is deposited over the first hard mask 206, the second hard mask 216, and the spacers 212. The third hard mask layer 218 includes any suitable material, for example, $SiO_2$, SiOC, SiC, SiCN, $Si_3N_4$, SiOCN, other suitable material, or combinations thereof. In some embodiments, the third hard mask layer 218 is a bottom anti-reflective coating (BARC) layer. The third hard mask layer 218 is formed by any suitable process, for example, a deposition process including CVD, PVD, ALD, spin on, other suitable methods, or combinations thereof. Thereafter, a photoresist layer 220 is formed over the third hard mask layer 218. The photoresist layer 220 is patterned such that a portion of the third hard mask layer 218 over the first hard mask layer 206 is exposed from the photoresist layer 220.

Figure 9A:
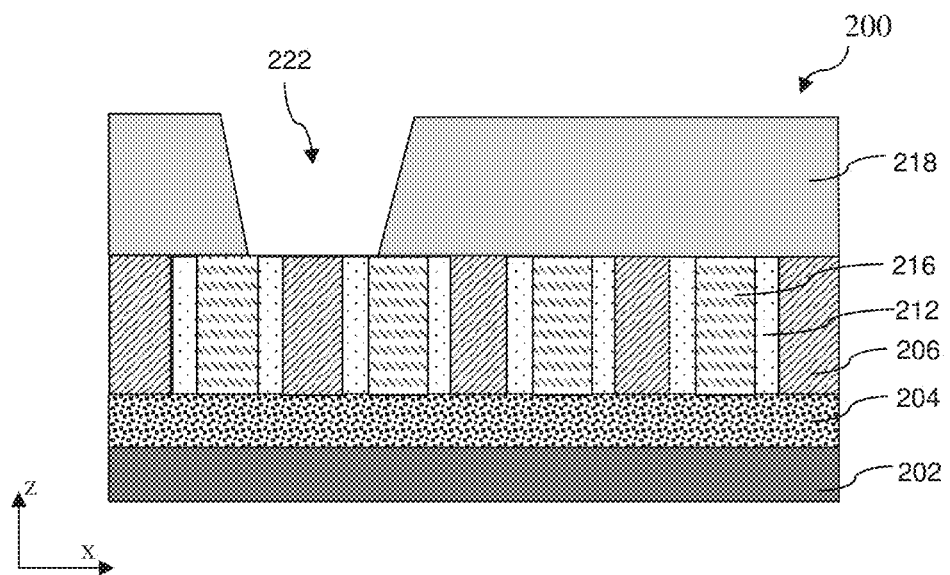
Figure 9B:
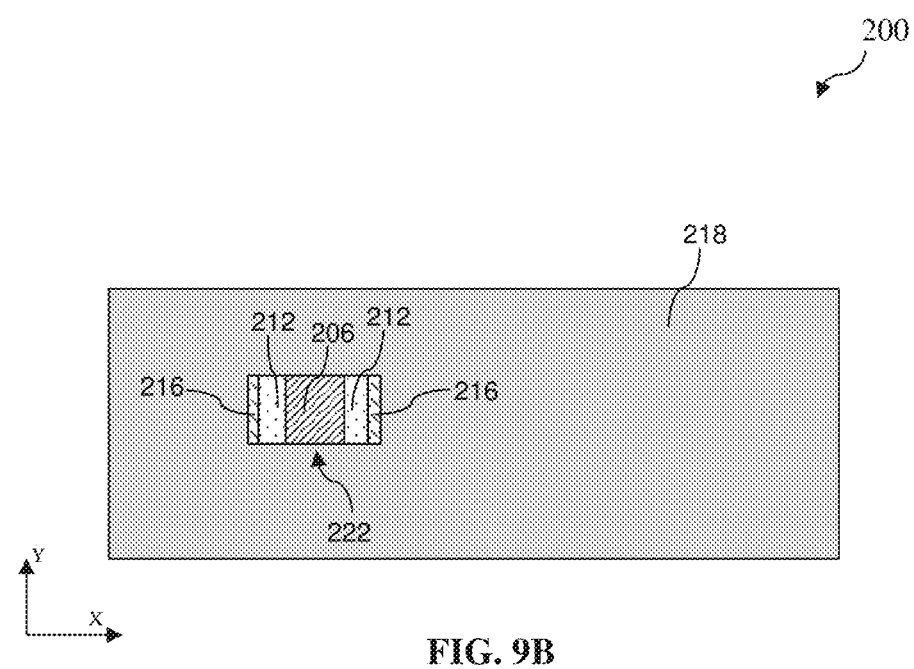

Referring to FIGS. 9A and 9B, the portion of the third hard mask layer 218 exposed in the photoresist layer 220 is removed to form a first opening 222 therein. The photoresist layer 220 (see FIG. 8A) is used as a mask element when the exposed portion of the third hard mask layer 218 is removed. In some embodiments, removing of the exposed portion of the third hard mask layer 218 includes a suitable etching process, such as a dry etch, a wet etch, or combinations thereof. For example, the etching process may be an RIE similar to that discussed above regarding FIGS. 4A and 4B when forming the first hard mask 206. As depicted in FIGS. 9A and 9B, after removing the exposed portion of the third hard mask layer 218, a portion of a first hard mask line 206 is exposed in the first opening 222. Since the first hard mask 206, the spacers 212, and the second hard mask 216 have different materials which can provide different etching selectivity during the etching process, the first opening 222 formed in the third hard mask layer 218 has a larger design window (or design tolerance) in the x-direction compared with a conventional semiconductor structure. In other words, even though portions of the spacers 212 and the second hard mask lines 216 next to the exposed first hard mask line 206 may also be exposed in the first opening 222, as depicted in FIG. 9B, the later formed first cut 224 (see FIGS. 10A and 11A) can still be limited to the first hard mask line 206.

Figure 10A:
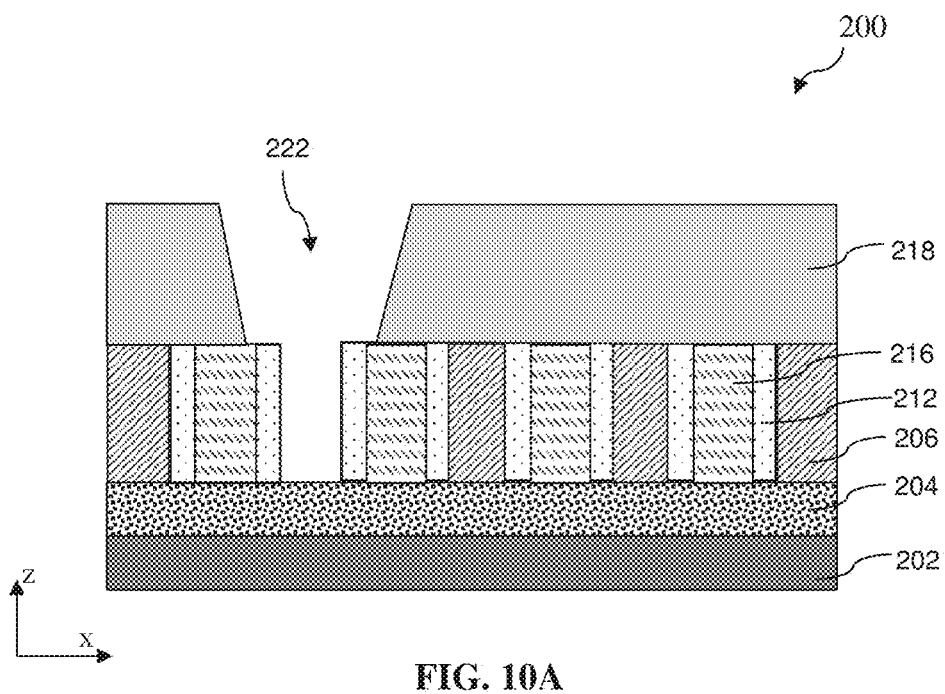
Figure 10B:
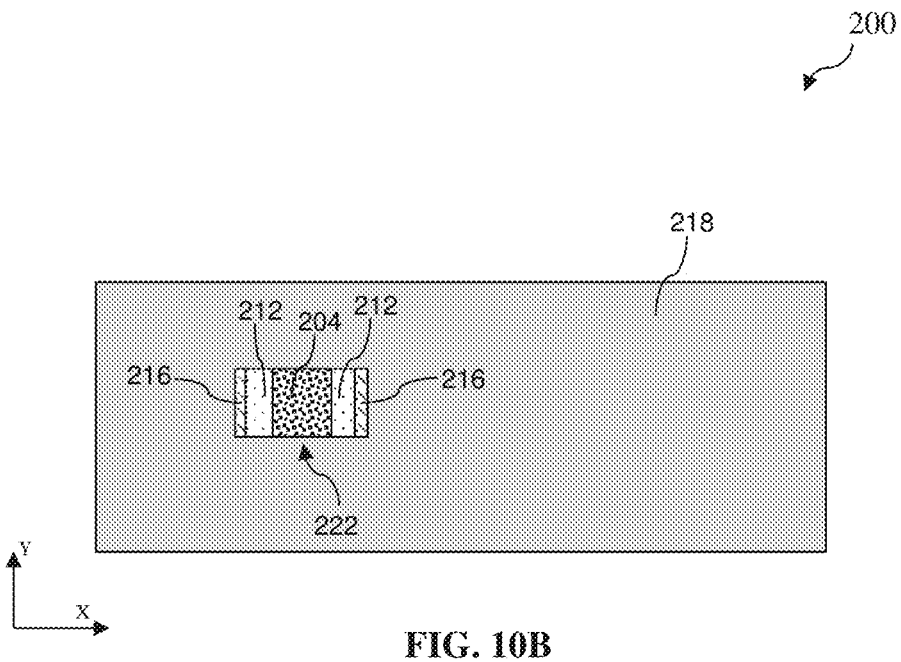
Figure 11A:
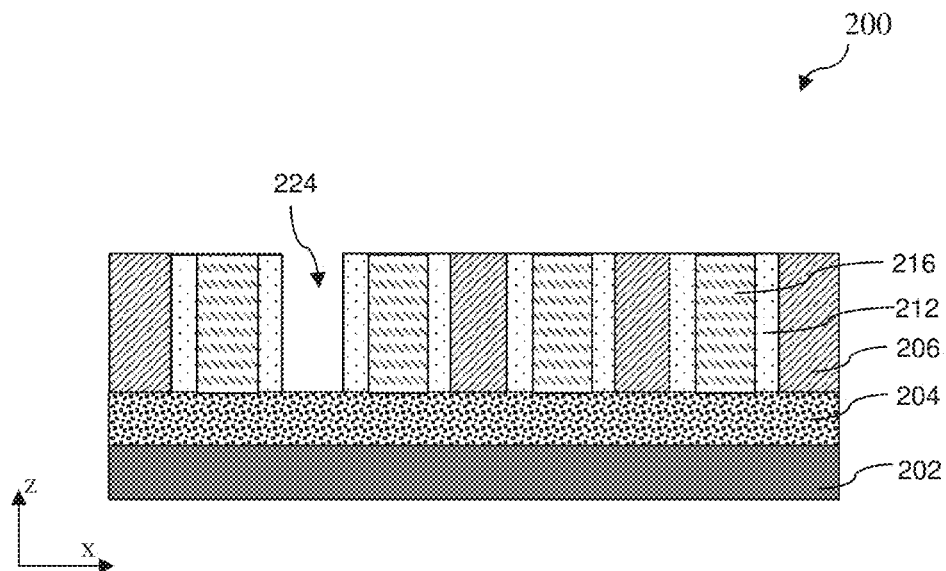
Figure 11B:
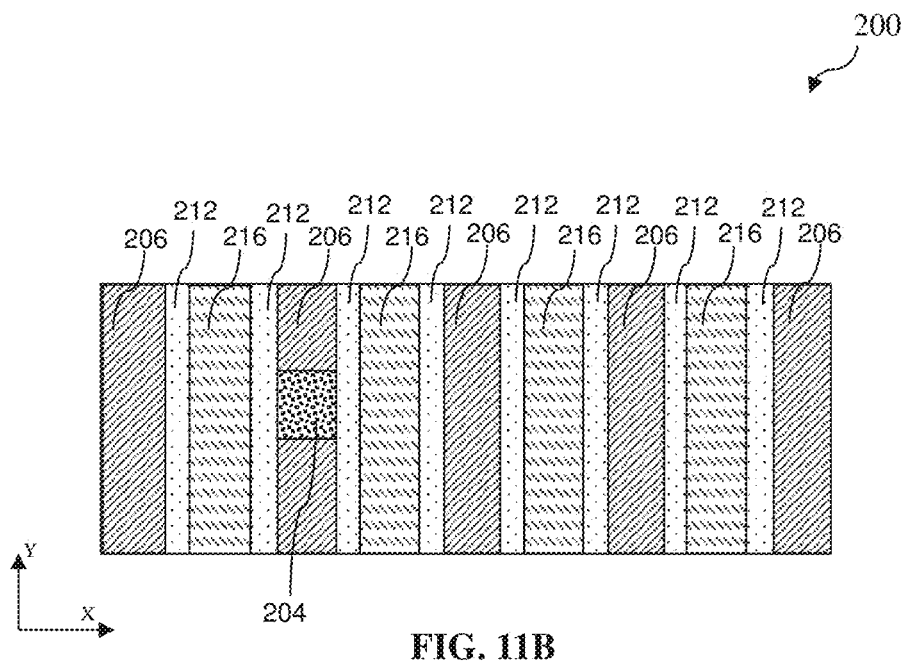
Figure 12A:
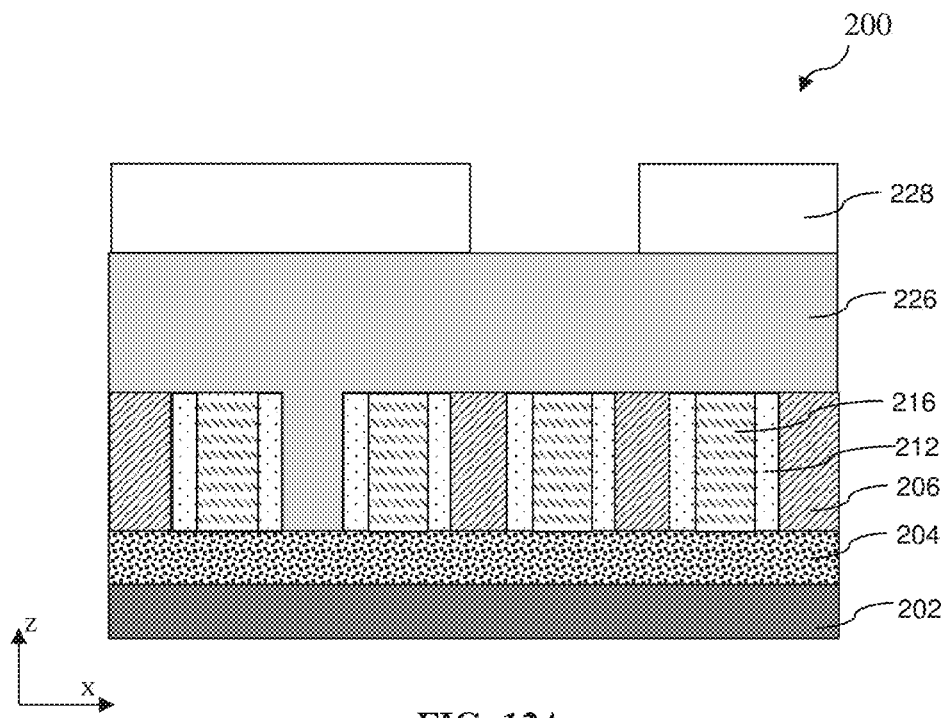
Figure 12B:
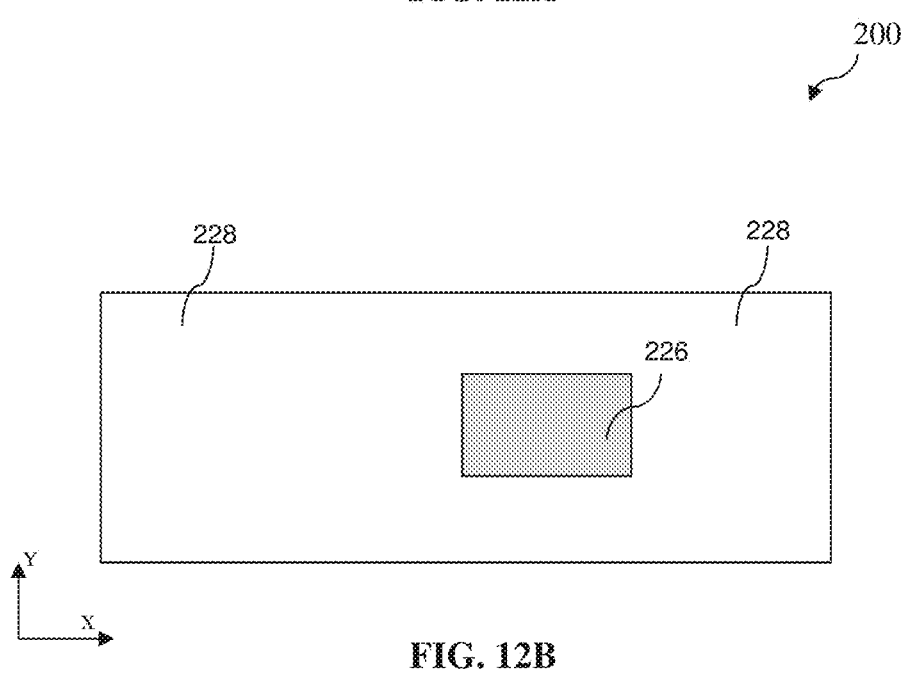

Now turning to FIGS. 10A and 10B, the exposed portion of the first hard mask line 206 is selectively removed from the first opening 222. Due to the different materials of the first hard mask 206, the second hard mask 216, and the spacers 212, the selective removing (including a dry etch, a wet etch, or combinations thereof) of the exposed portion of the first hard mask line 206 does not affect the exposed portions of the adjacent spacers 212 and the second hard mask lines 216. In some embodiments, the exposed portion of the first hard mask line 206 is removed from the first opening 222 by a selective RIE similar to that discussed above regarding FIGS. 4A and 4B when forming the first hard mask 206. Referring to FIGS. 11A and 11B, the third hard mask layer 218 is subsequently removed, the first cut (or the first cut trench) 224 is formed in the first hard mask line 206, and a portion of the ESL 204 is exposed from the first cut 224.

Figure 13A:
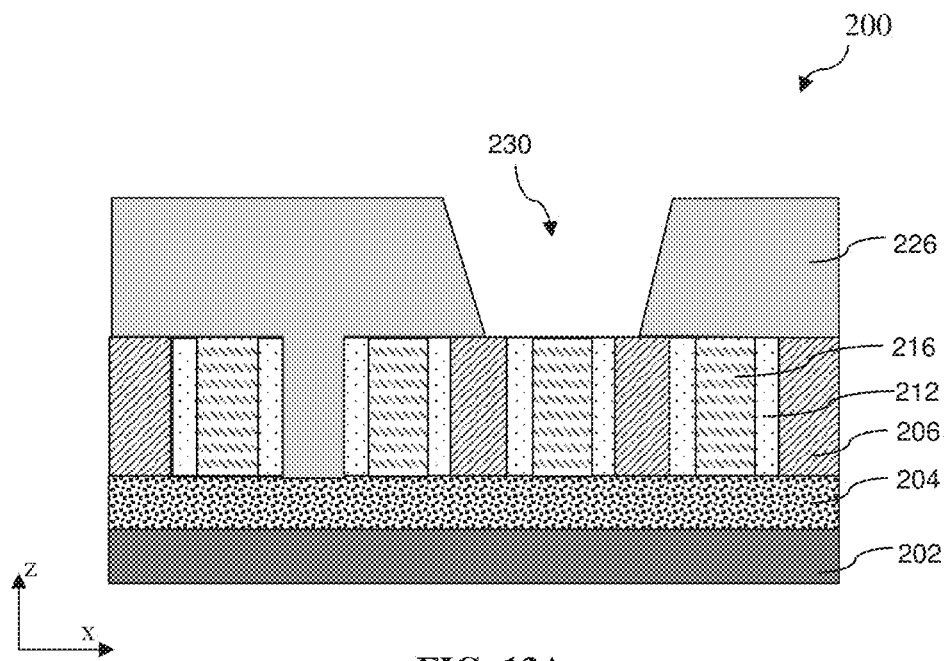
Figure 13B:
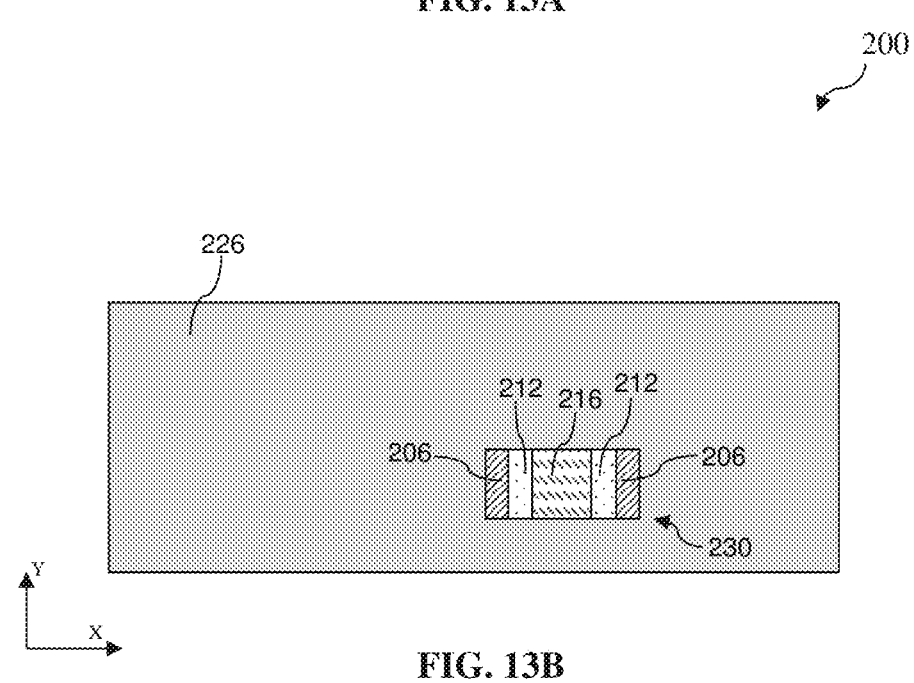
Figure 14A:
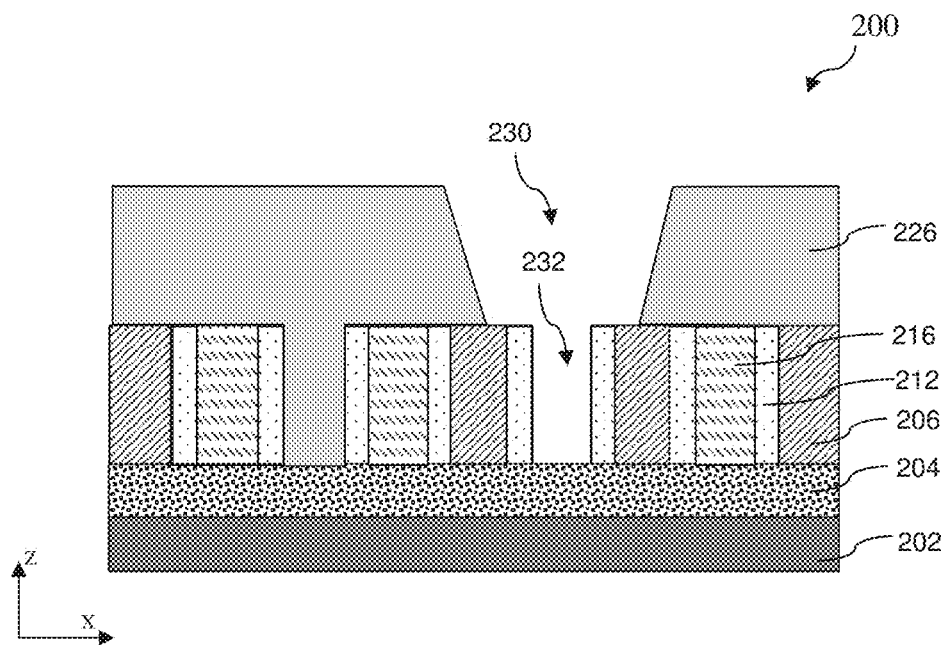
Figure 14B:
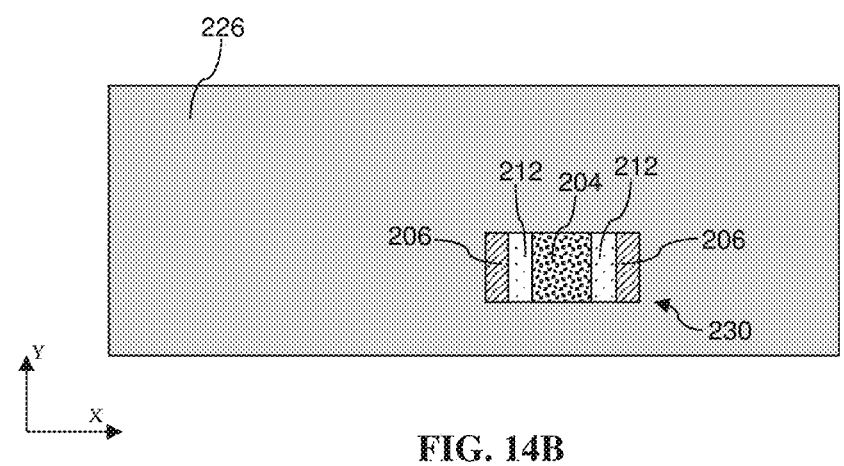
Figure 15A:
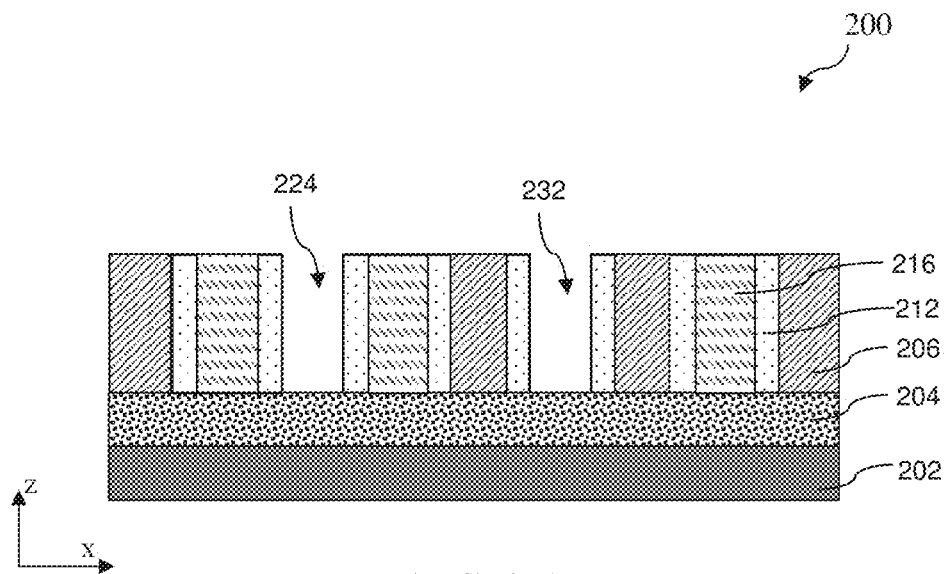
Figure 15B:
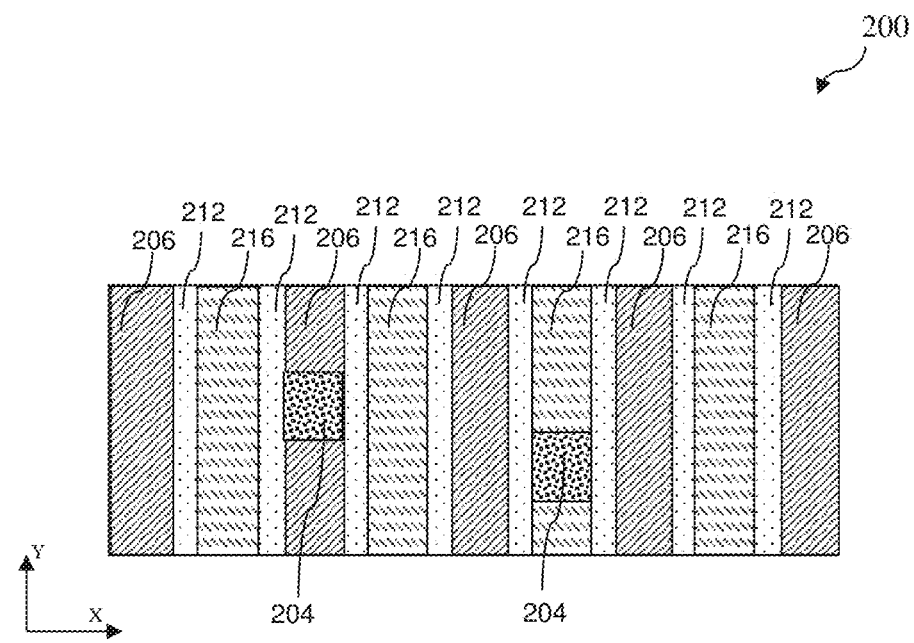

Now referring to FIGS. 1, 12A-12B to 15A-15B, at operation 112, a second cut 232 is formed in a second hard mask line 216 by another self-aligned patterning process. The self-aligned patterning process to form the second cut 232 is very similar to the formation of the first cut 224, except that the second cut is in a second hard mask line 216, rather than in a first hard mask line 206. For example, referring to FIGS. 12A and 12B, a fourth hard mask layer 226 is deposited over the first hard mask 206 (including in the first cut 224), the second hard mask 216, and the spacers 212. A photoresist layer 228 is deposited over the fourth hard mask layer 226 and is patterned. Referring to FIGS. 13A and 13B, a portion of the fourth hard mask layer 226 is removed using the photoresist layer 228 as a mask element, thereby forming a second opening 230 in the fourth hard mask layer 226. A portion of the second hard mask line 216 is exposed from the opening 230. The second opening 230 may also expose portions of the adjacent spacers 212 and adjacent first hard mask lines 206. Since the first hard mask 206, the spacers 212, and the second hard mask 216 have different materials which can provide different etching selectivity during the etching process, the second opening 230 formed in the fourth hard mask layer 226 has a larger design window (or design tolerance) in the x-direction compared with a conventional semiconductor structure. Thereafter, referring to FIGS. 14A and 14B, the exposed portion of the second hard mask line 216 in the second opening 230 is selectively removed. The second cut (or the second cut trench) 232 is formed in the second hard mask line 216. Subsequently, referring to FIGS. 15A and 15B, the fourth hard mask layer 226 is removed, including from the first cut 224. Thus, both the first cut 224 in the first hard mask line 206 and the second cut 232 in the second hard mask line 216 are formed by the self-aligned double patterning. Portions of the ESL 204 are exposed from the first cut 224 and the second cut 232.

Figure 16A:
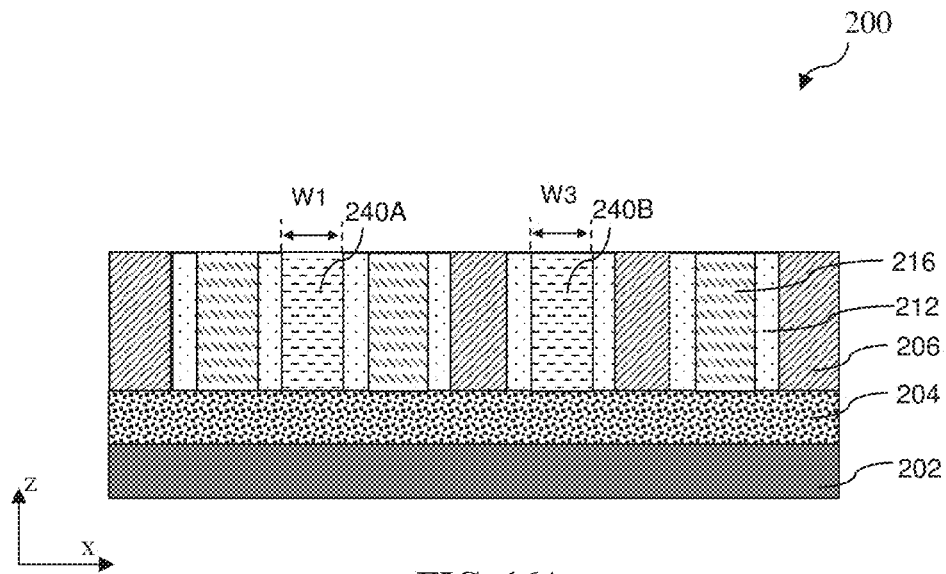
Figure 16B:
Figure 17A:
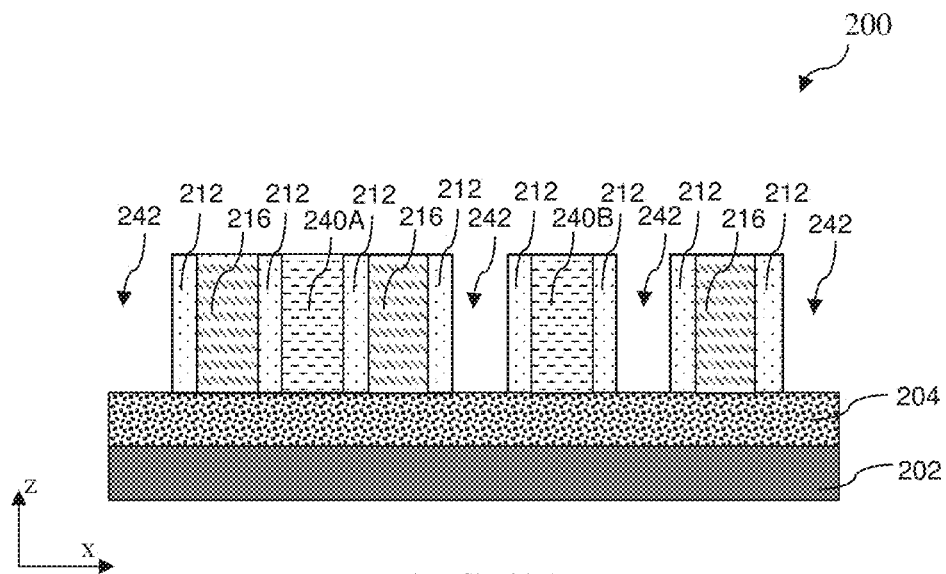
Figure 17B:
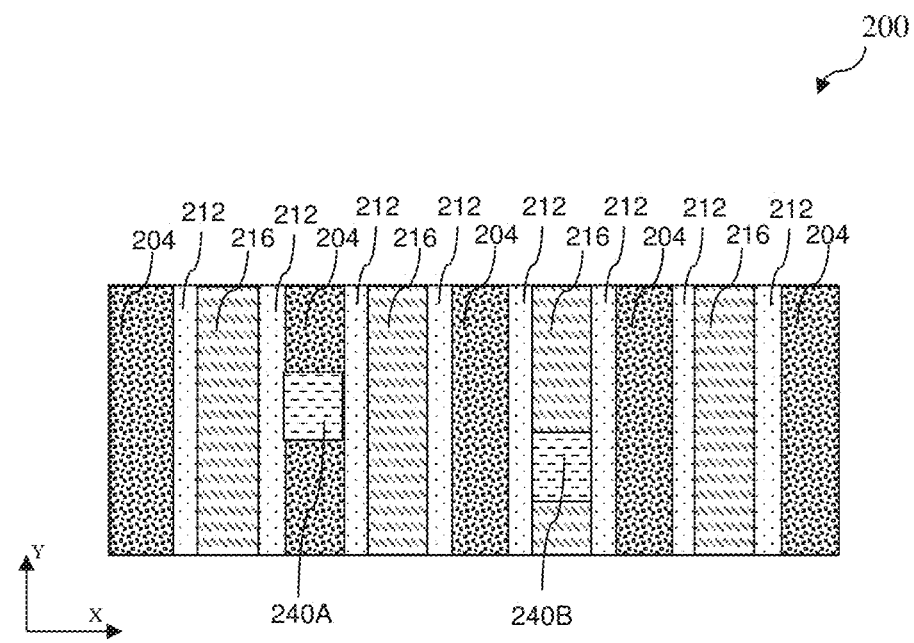
Figure 18A:
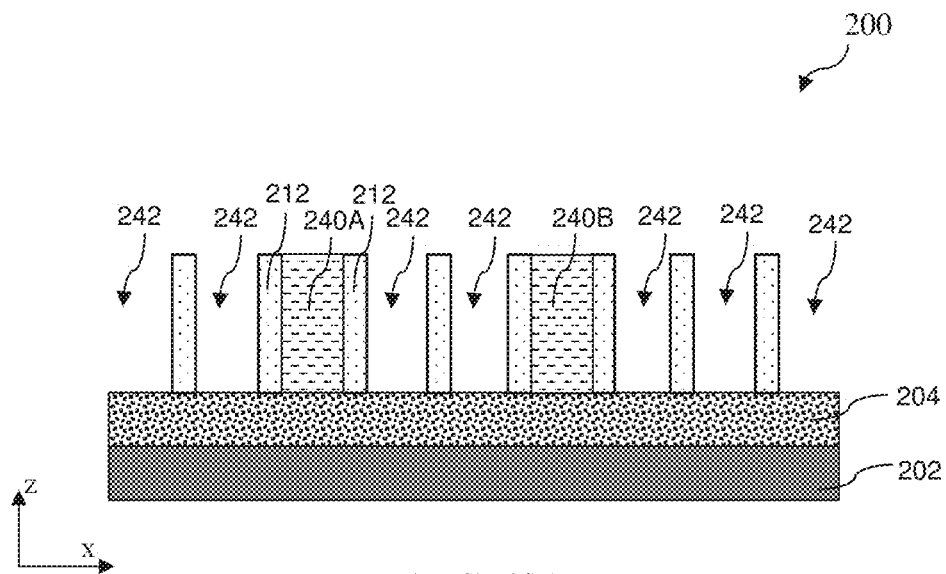
Figure 18B:
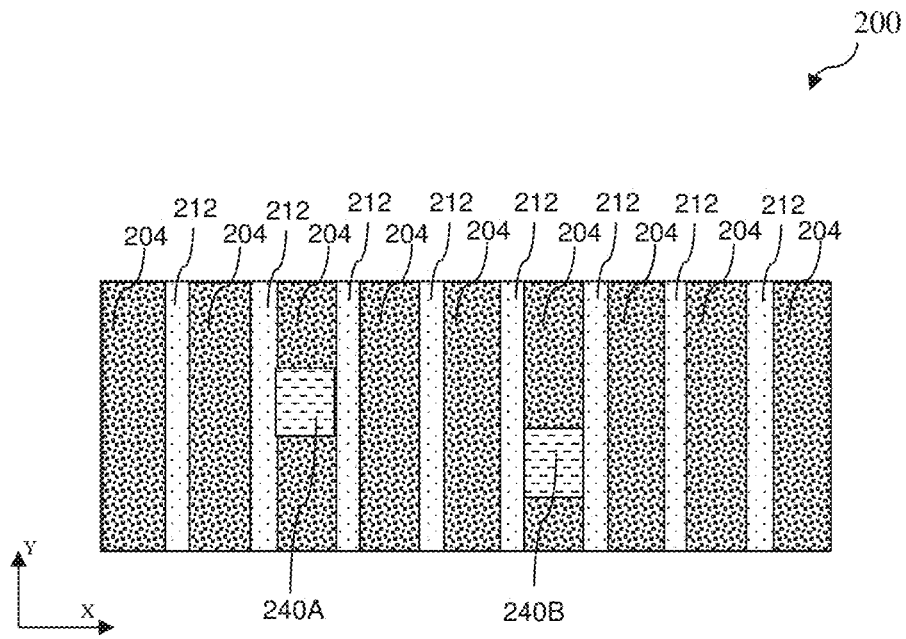

Now referring to FIGS. 1 and 16A-16B, at operation 114, cut hard masks 240A and 240B (both referred to as cut hard masks 240) are formed into the first cut 224 and the second cut 232, respectively. The cut hard masks 240 include a material that is different than the materials of the first hard mask 206, the second hard mask 216, and the spacers 212, such that the different materials can provide different etching selectivities in subsequent etching process. In some embodiments, the material of the cut hard masks 240 includes $SiO_2$, SiOC, SiC, SiCN, $Si_3N_4$, SiOCN, other dielectric materials, or combinations thereof. Formation of the cut hard masks 240 may include several steps. For example, first, a cut hard mask layer is deposited over the first hard mask 206, the second hard mask 216, the spacers 212, and fill in the first cut 224 and the second cut 232. The deposition may include CVD, PVD, ALD, spin on, other deposition method, or combinations thereof. Thereafter, a CMP or other planarization process is performed to remove a portion of the cut hard mask layer until the top surfaces of the first hard mask 206, the second hard mask 216, and the spacers 212 are exposed. The remaining portions of the cut hard mask layer in the first cut 224 and in the second cut 232 become the cut hard masks 240. As depicted in FIGS. 16A, the cut hard mask 240A formed in the first hard mask line 206 has a width in the x-direction, which substantially equals to the width W1 of the first hard mask line 206; and the cut hard mask 240B formed in the second hard mask line 216 has a width in the x-direction, which substantially equals to the width W3 of the second hard mask line 216.

Now referring to FIGS. 1, 17A-17B, and 18A-18B, at operation 116, the first hard mask 206 and the second hard mask 216 are selectively removed, thereby forming trenches 242 between the spacers 212. Since the first hard mask 206, the second hard mask 216, the spacers 212, and the cut hard masks 240 include different materials, the selective removal process only removes the first hard mask 206 and the second hard mask 216, while the spacer 212 and the cut hard masks 240 are substantially not affected. In some embodiments, the first hard mask 206 and the second hard mask 216 are selectively removed together by a wet etching process. In some other embodiments, as depicted in FIGS. 17A-17B and 18A-18B, the first hard mask 206 and the second hard mask 216 are separately removed in different steps by a dry etching process. For example, in FIGS. 17A and 17B, the first hard mask 206 is selectively removed. In an example, the selective removing includes a selective etching method such as inductively coupled plasma (ICP), capacitively coupled plasma (CCP), remote plasma, radical, or non-plasma, with etch gas such as $CH_4$, $CH_3F$, $CH_2F_2$, $CHF_3$, $C_4F_8$, $C_4F_6$, $CF_4$, HF, $NH_3$, $CH_3OH$, $C_2H_5OH$, Hz, HBr, CO, $CO_2$, $O_2$, $BCl_3$, or $Cl_2$, and a carrier gas such as $N_2$, He, Ne, or Ar. Thereafter, in FIGS. 18A and 18B, the second hard mask 216 is selectively removed with a different selective etching process. The order of the removal of the first and the second hard masks 206 and 216 is not limited as that depicted in FIGS. 17A-17B and 18A-18B. In another embodiment, the second hard mask 216 may be removed before removing the first hard mask 206. The selection of the etcher, the etch gas, and the carrier gas depends on the materials of hard mask 206 or 216 that is to be removed. After removing of the first and the second hard masks 206 and 216, the trenches 242 are formed between the spacers 212. And portions of the ESL 204 are exposed from the trenches 242.

Figure 19A:
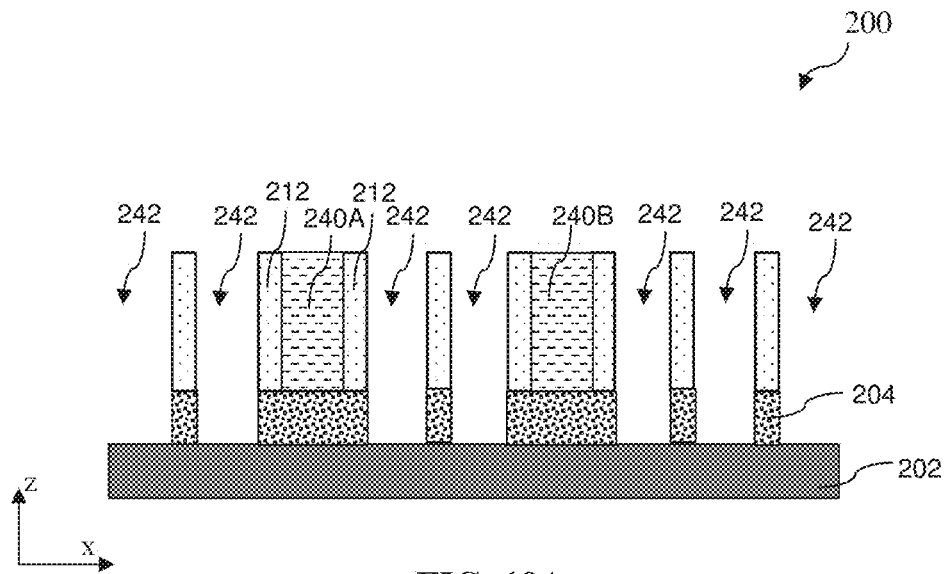
Figure 19B:
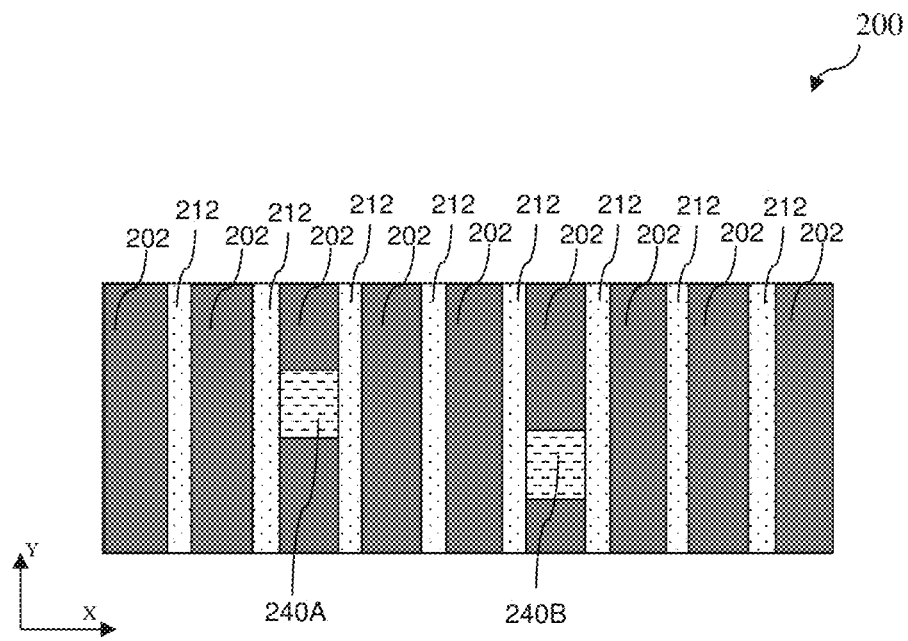
Figure 20A:
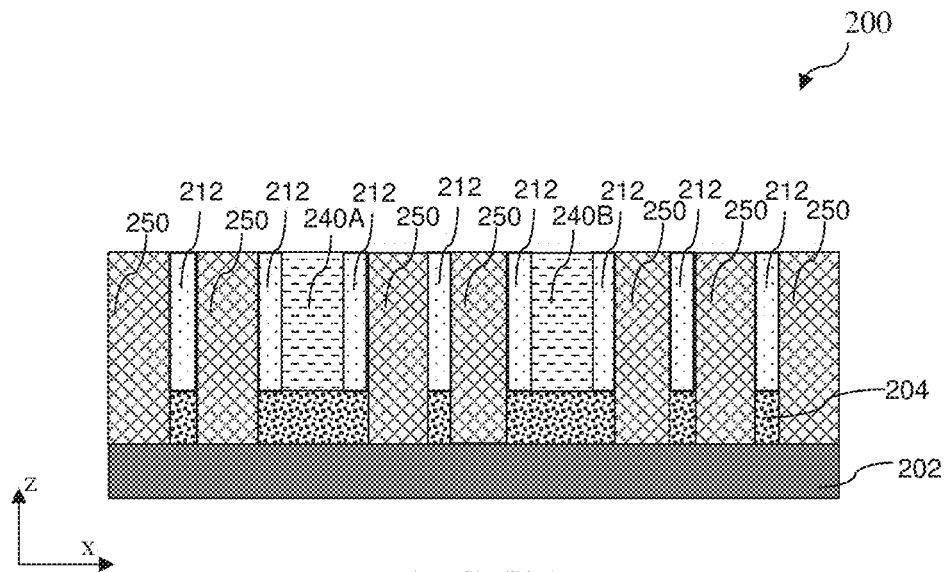
Figure 20B:
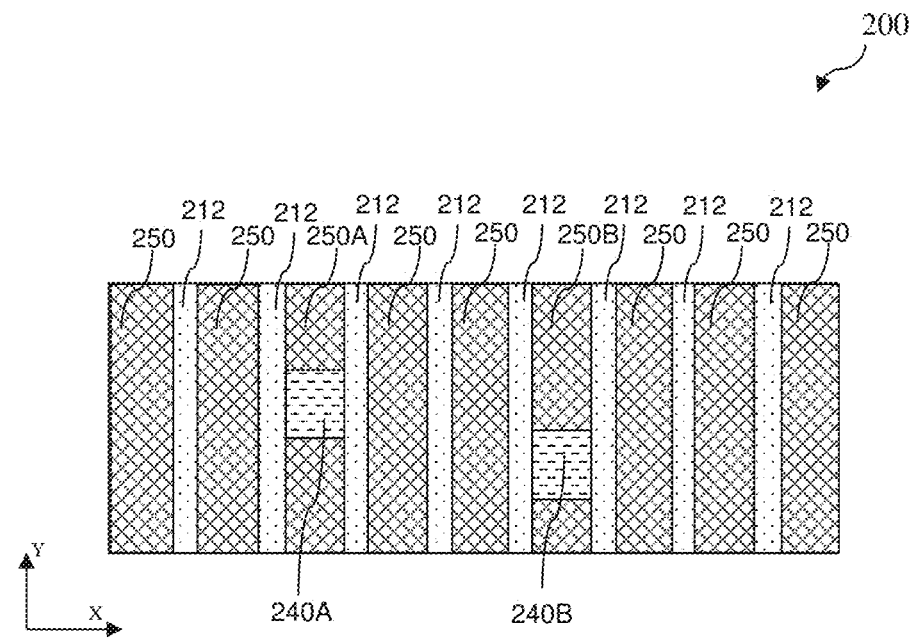

Now referring to FIGS. 1, 19A-19B, and 20A-20B, at operation 118, a conductive film 250 is deposited in the trenches 242. In some embodiments, before depositing the conductive film 250, the portions of the ESL 204 exposed from the trenches 242 are removed, as depicted in FIGS. 19A and 19B. The spacers 212 and the cut hard masks 240 are used as mask elements when the ESL 204 is removed. The removing process may include a wet etch, a dry etch, or combinations thereof. The structures formed in the substrate 202 are then exposed in the trenches 242. Thereafter, referring to FIGS. 20A and 20B, a conductive film 250 is deposited over the substrate 202 to fill in the trenches 242, such that a conductive connection can be set up between the semiconductor structure formed in the substrate 202, the conductive film 250, and other multilayer interconnect features (for example, contacts, vias, wires, and/or other conductive features). In some embodiments, the film 250 includes a conductive material different than the spacers 212 and the cut hard masks 240. For example, the conductive material of film 250 includes Ta, TaN, TiN, Cu, Co, Ru, Mo, W, other conductive material, or combinations thereof. In some embodiments, the conductive film 250 is deposited by PVD, CVD, ALD, plating, or other deposition process. The deposition may be performed at a temperature of about 150° C. to about 400° C. A CMP or other planarization process may be performed after the deposition of the metal film until the cut hard masks 240 and the spacers 212 are exposed at a top surface of the structure 200. As depicted in FIG. 20B, the conductive film 250 includes a plurality of lines separated by the spacers 112. Each of the lines is referred to as a conductive line 250. In the depicted embodiment, one conductive line 250A is split by the cut hard mask 240A into two portions, and another conductive line 250B is split by the cut hard mask 240B into two portions, along their lengthwise direction (the y-direction).

Figure 21A:
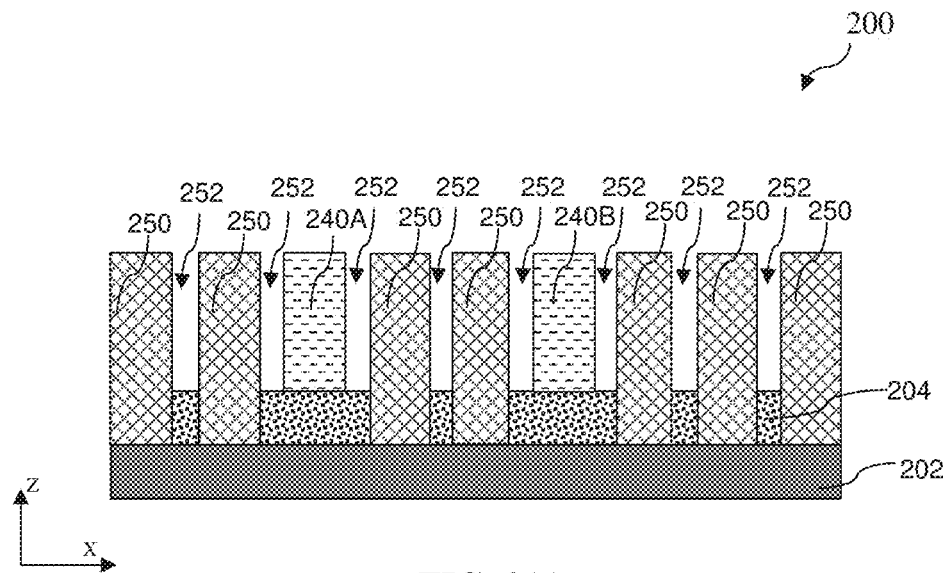
Figure 21B:
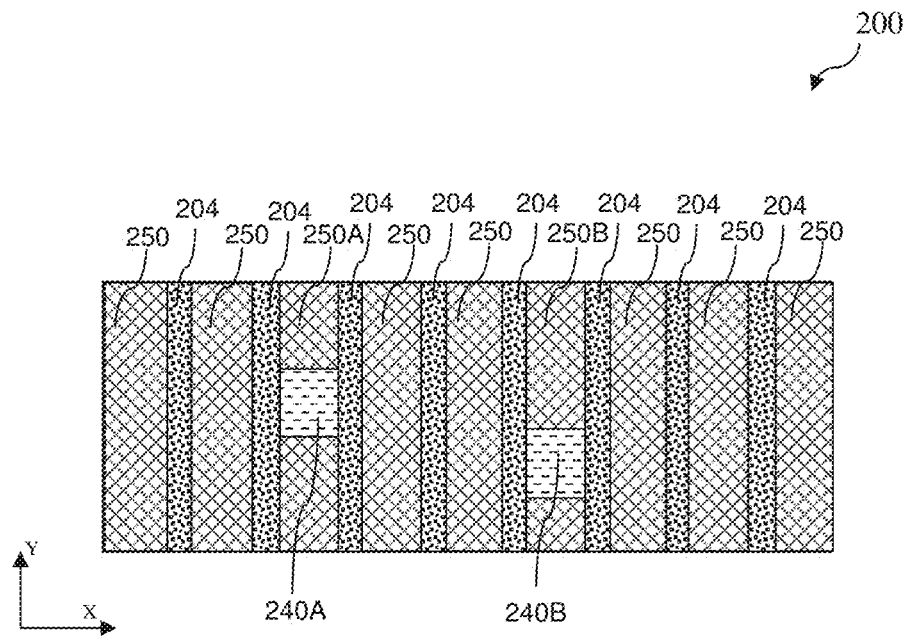

Now referring to FIGS. 1 and 21A-21B, at operation 120, the spacers 112 separating the conductive lines 250 are removed to form gaps 252, and portions of the ESL 204 are exposed from the gaps 252. Due to the different materials of the spacers 112, the cut hard masks 240, and the conductive lines 250, a selective etching process may be performed to remove only the spacers 112 and keep the cut hard masks 240 and the conductive lines 250 substantially unchanged. In an embodiment, the selective etching process to remove the spacers 212 is similar to the selective etching process for removing the first and the second hard masks 206 and 216.

Figure 22A:
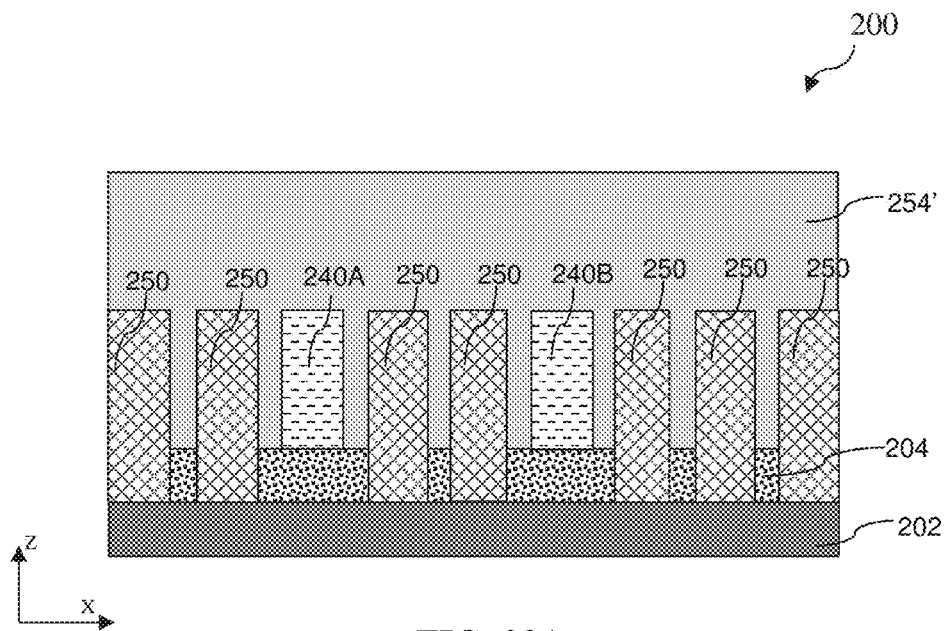
Figure 22B:
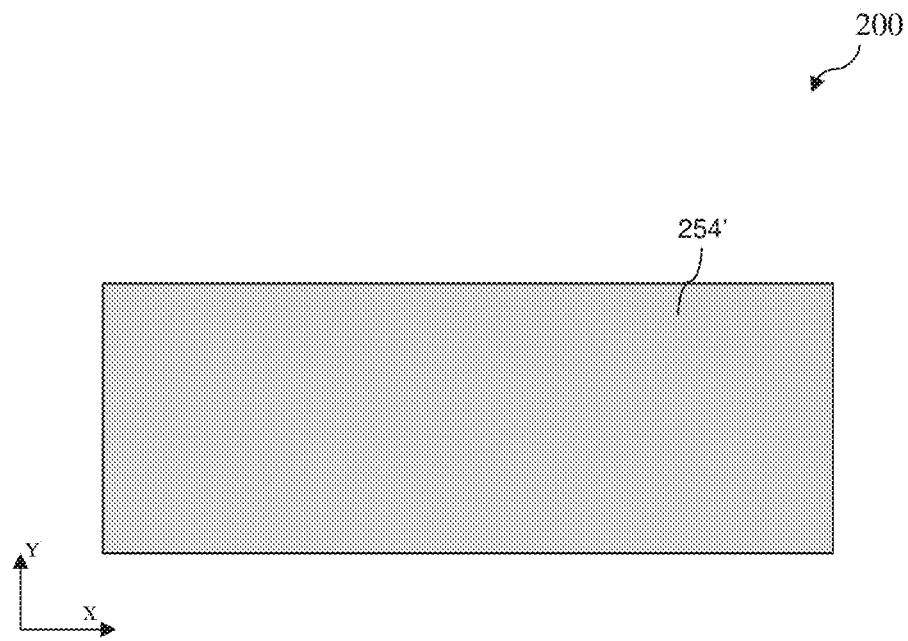

Now referring to FIGS. 1, 22A-22B, and 23A-23B, at operation 122, dielectric features 254 are formed in the gaps 252. Referring to FIGS. 22A and 22B, first, a dielectric film 254' is deposited over the conductive lines 250 and the cut hard masks 240, and fills in the gaps 252. The dielectric film 254' includes a material different than the material of the cut hard masks 240. In some embodiments, the material of the dielectric film 254' includes SiC, SiO$_2$, SiOC, Si$_3$N$_4$, SiCN, SiON, SiOCN, other dielectric material, or combinations thereof. The dielectric film 254' can be deposited by PVD, CVD, ALD, spin on, other deposition process, or combinations thereof, at a temperature of about 25° C. to about 400° C. Thereafter, referring to FIGS. 23A and 23B, a top portion of the dielectric film 254' is removed by a planarization process, e.g. CMP, to expose the conductive lines 250 and the cut hard masks 240. The remaining portions of the dielectric film 254' become the dielectric features 254.

Figure 23A:
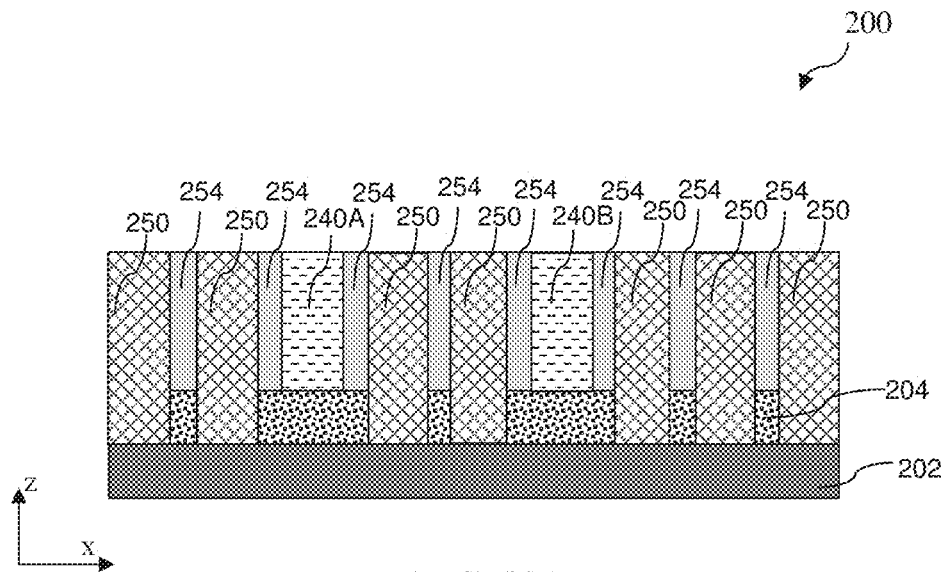
Figure 23B:
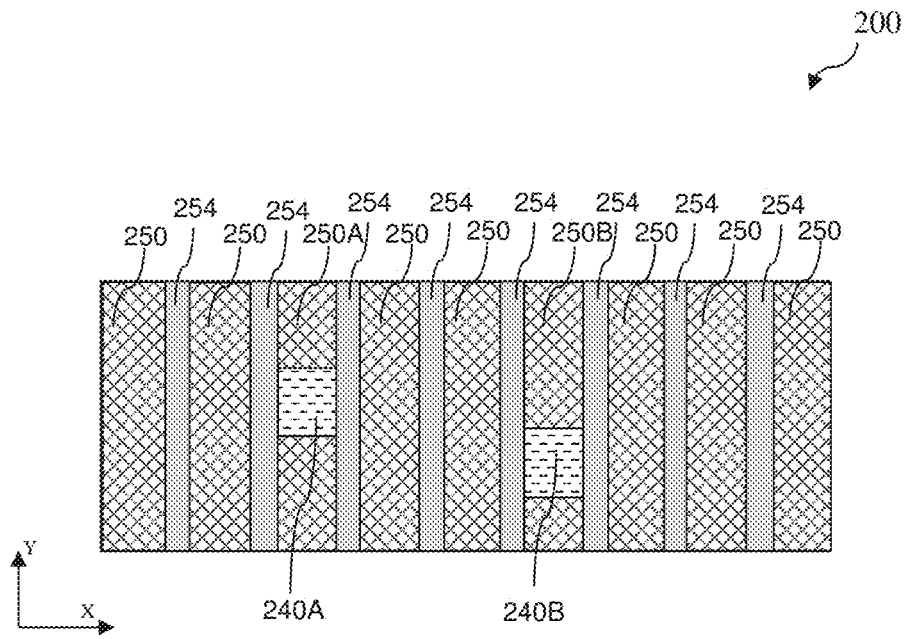

Still referring to FIGS. 23A and 23B, in this embodiment, the structure 200 includes various conductive lines 250, arranged lengthwise along the Y direction and separated from each other by the dielectric features 254 along the X direction. The conductive lines 250 include the conductive lines 250A and 250B. The structure 200 further includes the cut hard mask 240A interposing the conductive line 250A, such that the conductive line 250A is separated by the cut hard mask 240A into two portions along its lengthwise direction Since the cut hard mask 240A is formed in the self-aligned patterned first cut 224, the edges of the cut hard mask 240A in the x-direction is aligned with the edges of the conductive line 250A in the x-direction, and the cut hard mask 240A has a width in the x-direction that is substantially equals to the width of the conductive line 250A. In the lengthwise direction (y-direction) of conductive line 250A, the two ends (sidewalls) of the cut hard mask 240A directly contacts the ends (sidewalls) of the separated portions of the conductive line 250A, respectively. The dielectric feature 254 directly contacts sidewalls of the conductive lines 250 and sidewalls of the cut hard mask 240A. In the depicted embodiment, the cut hard mask 240B is formed in the conductive line 250B in a similar manner to the cut hard mask 240A. The ESL 204 is formed between the substrate 202 and the dielectric feature 254 and between the substrate 202 and the cut hard masks 240A and 240B.

Now referring to FIG. 1, at operation 124, further processes are performed to complete the fabrication of the structure 200. For example, contacts, vias, conductive wires, other multilayer interconnect features (e.g. conductive layers and interlayer dielectrics) may be formed over the substrate 202, configured to connect the various features to form a functional circuit that may include one or more semiconductor structures.

Although not intended to be limiting, one or more embodiments of the present disclosure provide many benefits to a semiconductor structure and a formation process thereof. For example, embodiments of the present disclosure provide a semiconductor structure with conductive lines and cut hard masks interposing in the conductive lines with good alignment. The cut hard masks are formed in different hard mask layers in different steps by self-aligned double patterning process. Compared with conventional semiconductor fabrication methods, the present disclosure allows larger design window when patterning the hard mask layers (e.g., creating openings therein with larger design margin) to increase design window due to the good etching selectivity of the materials of the hard mask layers and the spacers. In addition, the selective removing of the hard mask layers allows self-aligned deposition of the conductive film. In other words, the conductive lines and the cut hard masks can be formed with good alignment. Accordingly, the overly shifting issue in the conventional fabrication can be mitigated to avoid the conductive bridge and current leakage issues. Therefore, the manufacturing defects can be reduced, and the performance of the semiconductor structure can be improved.

The present disclosure provides for many different embodiments. Semiconductor device having self-aligned cut hard mask and methods of fabrication thereof are disclosed herein. An exemplary method comprises receiving a structure including a substrate and a first hard mask over the substrate, the first hard mask having at least two separate portions; forming spacers along sidewalls of the at least two portions of the first hard mask with a space between the spacers; forming a second hard mask in the space; forming a first cut in the at least two portions of the first hard mask; forming a second cut in the second hard mask; and depositing a cut hard mask in the first cut and the second cut.

In some embodiments, the first hard mask, the second hard mask, the spacers, and the cut hard mask include different materials, such as tantalum, tantalum nitride, titanium nitride, zirconium oxide, titanium oxide; titanium silicon oxide, zirconium titanium oxide, hafnium oxide, silicon oxide, silicon oxycarbide, silicon carbide, silicon carbonitride, silicon oxycarbonitride, silicon nitride, tungsten oxide, tungsten nitride, tungsten carbide, tungsten carbonitride, or tungsten.

In some embodiments, the method further comprises replacing the first hard mask and the second hard mask with a conductive film. For example, selectively removing the first hard mask and the second hard mask to form trenches between the spacers and depositing a conductive film in the trenches between the spacers. In some embodiments, selectively removing the first hard mask and the second hard mask includes selectively etching the first hard mask and the second hard mask separately by dry etching. In some further embodiments, the dry etching is performed with a process gas including $CH_4$, $CH_3F$, $CH_2F_2$, $CHF_3$, $C_4F_8$, $C_4F_6$, $CF_4$, HF, $NH_3$, $CH_3OH$, $C_2H_5OH$, $H_2$, HBr, CO, $CO_2$, $O_2$, $BCl_3$, or $C_{12}$. In some other embodiments, selectively removing the first hard mask and the second hard mask includes selectively etching the first hard mask and the second hard mask together by wet etching.

In some embodiments, the substrate further includes an etch stop layer (ESL) under the first hard mask; and replacing the first mask and the second mask with a conductive film comprises selectively removing the first mask and the second mask to form trenches between the spacers, wherein portions of the ESL are exposed in the trenches; removing the exposed portions of the ESL from the trenches; and depositing a metal film to fill in the trenches between the spacers.

In some embodiment, the method further comprises removing the spacers to form gaps between portions of the conductive film and between the cut hard mask and the conductive film; depositing a dielectric layer to fill in the gaps; and performing a planarization process to remove at least a portion of the dielectric layer to expose a top surface of the conductive film and a top surface of the cut hard mask.

Another exemplary method comprises receiving a structure including a substrate and a first hard mask over the substrate, the first hard mask having at least two separate portions; forming spacers along sidewalls of the at least two portions of the first hard mask with a space between the spacers; forming a second hard mask in the space; forming a first cut in the at least two portions of the first hard mask; forming a second cut in the second hard mask; depositing a cut hard mask in the first cut and the second cut; and replacing the first hard mask and the second hard mask with a metal film.

In some embodiments, the structure further includes an etch stop layer (ESL) between the substrate and the first hard mask, wherein replacing the first hard mask and the second hard mask with the metal film includes selectively removing the first hard mask and the second hard mask to form trenches between the spacers, wherein the ESL exposed from the trenches between the spacers; removing the ESL exposed from the trenches; and depositing a conductive film in the trenches between the spacers.

In some embodiments, forming the first cut in the at least two portions of the first hard mask includes forming a third hard mask layer over the first hard mask, the spacers, and the second hard mask; forming a photoresist layer over the third hard mask layer; patterning the third hard mask layer to form a first opening; and selectively etching the first hard mask through the first opening. In some further embodiments, forming the second cut in the second hard mask includes forming a fourth hard mask layer over the first hard mask, the spacers, and the second hard mask, and in the first cut; forming another photoresist layer over the fourth hard mask layer; patterning the fourth hard mask layer to form a second opening; and selectively etching the second hard mask through the second opening An exemplary semiconductor structure comprises a substrate; a first conductive line over the substrate and including a first portion and a second portion along a lengthwise direction of the first conductive line; and a first dielectric feature over the substrate and between the first portion and the second portion of the first conductive line, wherein the first dielectric feature has a width substantially same as a width of the first conductive line.

In some embodiments, in the lengthwise direction of the first conductive line, a first end of the first dielectric feature directly contacts an end of the first portion of the conductive line and a second end of the first dielectric feature directly contacts an end of the second portion of the conductive line.

In some embodiments, the semiconductor structure further comprises a second conductive line disposed in a same layer as and to a side of the first conductive line; and a second dielectric feature over the substrate and between the second conductive line and the first conductive line. In some further embodiments, a sidewall along a lengthwise direction of the second dielectric feature directly contact a sidewall of the first and the second portions of the first conductive line and a sidewall of the first dielectric feature. In some further embodiments, a dielectric material of the first dielectric feature is different than a dielectric material of the second dielectric feature.

In some embodiments, the semiconductor structure further comprises an etch stop layer including a first portion disposed between the second dielectric feature and the substrate and a second portion disposed between the first dielectric feature and the substrate, where the first and the second portions of the etch stop layer are different.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first conductive line disposed on a substrate, the first conductive line including a first portion and a second portion that is spaced apart from the first portion, the first portion and the second portion elongated along a first axis and having a substantially constant first width along a second axis that is substantially perpendicular to the first axis, wherein at least one of the first and second portions extends to a first height above the substrate; and
   a first dielectric feature disposed on the substrate and interfacing with both the first portion and the second portion of the first conductive line, the first dielectric feature elongated along the first axis and having the substantially constant first width along the second axis, the first dielectric feature extending to the first height above the substrate.

2. The device of claim 1, further comprising a second dielectric feature extending continuously from the first portion of the first conductive line to the second portion of the first conductive line.

3. The device of claim 2, wherein the second dielectric feature interfaces with the first portion of the first conductive line, the second portion of the first conductive line and the first dielectric feature.

4. The device of claim 2, wherein the first dielectric feature has a different material composition than the second dielectric feature.

5. The device of claim 2, wherein the second dielectric feature is elongated along the first axis and has a substantially constant second width along the second axis, the second width being different than the first width.

6. The device of claim 5, wherein the second width is less than the first width.

7. The device of claim 1, further comprising an etch stop layer disposed on the substrate, and
   wherein the first dielectric feature is disposed directly on the etch stop layer.

8. The device of claim 1, wherein the first portion of the first conductive line extends closer to the substrate than the first dielectric feature.

9. A device comprising:
a first conductive line disposed on a substrate, the first conductive line including a first portion and a second portion that is spaced apart from the first portion, the first portion and the second portion elongated along a first axis and having a substantially constant first width along a second axis that is substantially perpendicular to the first axis;
a first dielectric feature disposed on the substrate and interfacing with both the first portion and the second portion of the first conductive line, the first dielectric feature elongated along the first axis and having the substantially constant first width along the second axis; and
a second dielectric feature disposed on the substrate and elongated along the first axis and having a substantially constant second width along the second axis, the second dielectric feature interfacing with the first portion of the first conductive line, the second portion of the first conductive line and the first dielectric feature.

10. The device of claim 9, wherein the first conductive line, the first dielectric feature and the second dielectric feature extend to the same height above the substrate.

11. The device of claim 9, wherein both the first and second portions of the first conductive line are positioned closer to the substrate than either of the first and second dielectric features.

12. The device of claim 9, further comprising a second conductive line disposed on the substrate and elongated along the first axis, the second conductive line having a substantially constant first width along the second axis, and wherein the second conductive line interfaces with the second dielectric feature.

13. The device of claim 12, wherein the second conductive line extends along the first axis a greater distance than either of the first and second portions of the first conductive line.

14. The device of claim 9, wherein the first and second portions of the first conductive line have the same material composition.

15. The device of claim 9, wherein the first dielectric feature includes a material selective from the group consisting of $SiO_2$, SiOC, SiC, SiCN, $Si_3N_4$ and SiOCN, and
wherein both the first and second portions of the first conductive line include a material selected from the group consisting of Ta, TaN, TiN, Cu, Co, Ru, Mo and W.

16. The device of claim 9, further comprising an etch stop layer disposed on the substrate, the etch stop layer having a top surface facing away from the substrate, and
wherein the first dielectric feature and the second dielectric feature interface with the top surface of the etch stop layer such that the first dielectric feature and the second dielectric feature are prevented from interfacing with the substrate by the etch stop layer.

17. A method comprising:
forming a first hard mask line on a substrate, the first hard mask line elongated along a first axis;
forming a second hard mask line on the substrate, the second hard mask line elongated along the first axis and having a different material composition than the first hard mask line;
removing a first portion of the first hard mask line to form a first trench;
forming a first dielectric feature in the first trench;
removing a second portion of the first hard mask line to form a second trench that exposes the first dielectric feature;
removing a first portion of the second hard mask line to form a third trench; and
forming a first conductive line in the second trench and a second conductive line in the third trench, wherein the first conductive line is elongated along the first axis and has a substantially constant first width along a second axis that is substantially perpendicular to the first axis, and wherein the first dielectric feature is elongated along the first axis and has the substantially constant first width along the second axis, the first conductive line and the first dielectric feature extending to a first height above the substrate and interfacing with each other.

18. The method of claim 17, further comprising forming a spacer feature on the first hard mask line prior to forming the second hard mask line on the substrate.

19. The method of claim 18, further comprising removing the spacer feature to form a fourth trench after forming the first conductive line in the second trench and the second conductive line in the third trench.

20. The method of claim 19, further comprising forming a second dielectric feature in the fourth trench, the second dielectric feature interfacing with the first conductive line, the second conductive line and the first dielectric feature after forming the second dielectric feature in the fourth trench.

* * * * *